US012684923B2

(12) United States Patent
Lee

(10) Patent No.: US 12,684,923 B2
(45) Date of Patent: Jul. 14, 2026

(54) TRANSFER SUBSTRATE USED FOR MANUFACTURING DISPLAY DEVICE, DISPLAY DEVICE, AND METHOD FOR MANUFACTURING DISPLAY DEVICE

(71) Applicant: LG ELECTRONICS INC., Seoul (KR)

(72) Inventor: Minwoo Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 721 days.

(21) Appl. No.: 18/017,215

(22) PCT Filed: Jul. 21, 2020

(86) PCT No.: PCT/KR2020/009614
§ 371 (c)(1),
(2) Date: Jan. 20, 2023

(87) PCT Pub. No.: WO2022/019349
PCT Pub. Date: Jan. 27, 2022

(65) Prior Publication Data
US 2023/0275181 A1 Aug. 31, 2023

(51) Int. Cl.
| | |
|---|---|
| *H10H 29/14* | (2025.01) |
| *H10H 20/01* | (2025.01) |
| *H10H 20/83* | (2025.01) |
| *H10H 20/851* | (2025.01) |
| *H10H 20/857* | (2025.01) |
| *H10H 29/24* | (2025.01) |
| *H10H 29/37* | (2025.01) |

(52) U.S. Cl.
CPC ........ *H10H 29/142* (2025.01); *H10H 20/018* (2025.01); *H10H 20/83* (2025.01); *H10H 20/8511* (2025.01); *H10H 20/857* (2025.01); *H10H 29/24* (2025.01); *H10H 29/37* (2025.01); *H10H 20/032* (2025.01)

(58) Field of Classification Search
None
See application file for complete search history.

(56) References Cited

U.S. PATENT DOCUMENTS

| | | | |
|---|---|---|---|
| 2009/0321738 A1* | 12/2009 | Kim ........................ | B82Y 10/00 257/E33.001 |
| 2011/0012155 A1* | 1/2011 | Huang ................... | H10H 20/01 257/E33.074 |

(Continued)

FOREIGN PATENT DOCUMENTS

| | | |
|---|---|---|
| CN | 110024484 A | 7/2019 |
| JP | 2014-512699 A | 5/2014 |

(Continued)

*Primary Examiner* — Feifei Yeung Lopez
(74) *Attorney, Agent, or Firm* — Birch, Stewart, Kolasch & Birch, LLP

(57) ABSTRACT

The present invention relates to a display device using a semiconductor light emitting element and a manufacturing method therefor. The display device comprises: a base substrate including a circuit wiring; a lower electrode part provided on the base substrate and connected to the circuit wiring; and a plurality of nanorod type semiconductor light emitting elements separated from each other and vertically arranged on the lower electrode part.

9 Claims, 24 Drawing Sheets

(56) References Cited

U.S. PATENT DOCUMENTS

| | | | | |
|---|---|---|---|---|
| 2012/0132888 | A1* | 5/2012 | Kwak | ................... B82Y 20/00 |
| | | | | 977/932 |
| 2017/0338211 | A1 | 11/2017 | Lin et al. | |
| 2017/0358503 | A1* | 12/2017 | Liu | ...................... H01L 21/288 |
| 2019/0229234 | A1* | 7/2019 | Zou | .................... H01L 25/0753 |
| 2019/0245113 | A1 | 8/2019 | Chang | |
| 2022/0190026 | A1* | 6/2022 | Levy | ..................... H10H 20/01 |

FOREIGN PATENT DOCUMENTS

| | | | |
|---|---|---|---|
| KR | 10-2006-0121413 | A | 11/2006 |
| KR | 10-2013-0127389 | A | 11/2013 |
| KR | 10-2018-0009015 | A | 1/2018 |
| KR | 10-2018-0009118 | A | 1/2018 |
| KR | 10-2020-0026664 | A | 3/2020 |
| KR | 10-2020-0027136 | A | 3/2020 |

* cited by examiner

TRANSFER SUBSTRATE USED FOR MANUFACTURING DISPLAY DEVICE, DISPLAY DEVICE, AND METHOD FOR MANUFACTURING DISPLAY DEVICE

CROSS REFERENCE TO RELATED APPLICATIONS

This application is the National Phase of PCT International Application No. PCT/KR2020/009614, filed on Jul. 21, 2020, all of which is hereby expressly incorporated by reference into the present application.

TECHNICAL FIELD

The present disclosure is applicable to a display device-related technical field, and relates to, for example, a method for manufacturing a display device using light emitting diodes (LEDs) and a transfer substrate used for manufacturing the display device.

BACKGROUND

Recently, in a field of a display technology, display devices having excellent characteristics such as thinness, flexibility, and the like have been developed. On the other hand, currently commercialized major displays are represented by a LCD (liquid crystal display) and an OLED (organic light emitting diode).

However, the LCD has a response time that is not fast, and is difficult to be flexibly implemented.

On the other hand, LED (light emitting diode), which is a well-known semiconductor light-emitting element that converts electric current into light, has been used as a light source for a display image of an electronic device including an information and communication device along with a GaP:N-based green LED, starting with commercialization of a red LED using a GaAsP compound semiconductor in 1962. Accordingly, a method for solving the above-described problems by implementing a display using the semiconductor light-emitting element may be proposed. Such light emitting diode has various advantages, such as long lifespan, low power consumption, excellent initial driving characteristics, high vibration resistance, and the like, compared to a filament-based light-emitting element.

In a manufacturing process of such an LED, a process of separating a light emitting element from a growing substrate and transferring the separated light emitting element to a driving substrate is essential. However, as a size of a chip of the separated LED decreases, high precision and process difficulty are required in the transfer process of the LED.

Accordingly, in the present disclosure, a display device and a method for transferring the same capable of placing the chip at a desired position while having high positioning precision are presented in order to implement the transfer of the LED, especially a micro display having a subminiature and high-density chip arrangement.

SUMMARY

Technical Problem

One embodiment of the present disclosure is to provide a transfer process for manufacturing a display device in which nanorod-type semiconductor light emitting elements are separated from a growing substrate using an MLO.

Furthermore, one embodiment of the present disclosure is to solve various problems not mentioned herein. A person skilled in the art may understand this via the entire meaning of the present document and the drawings.

Technical Solutions

In a transfer substrate used for manufacturing a display device using semiconductor light emitting elements for achieving the above object, the display device includes a base substrate including circuit wiring, lower electrodes arranged on the base substrate and connected to the circuit wiring, and a plurality of nanorod-type semiconductor light emitting elements vertically arranged on each lower electrode so as to be spaced apart from each other.

In addition, an end of each nanorod-type semiconductor light emitting element opposite to one end thereof in contact with the lower electrode includes a non-flat contact surface.

In addition, the non-flat contact surface may be formed by segmenting a porous region included in the nanorod-type semiconductor light emitting element.

In addition, the plurality of nanorod-type semiconductor light emitting elements may be arranged at a predetermined spacing in an entire region of a top surface of each lower electrode.

In addition, at least some of the plurality of nanorod-type semiconductor light emitting elements may be arranged over edges of the top surface of each lower electrode.

In addition, the display device may further include a cover substrate stacked on the plurality of nanorod-type semiconductor light emitting elements, and each upper electrode disposed on the cover substrate and in contact with the plurality of nanorod-type semiconductor light emitting elements.

In addition, the display device may further include first partition walls arranged between the base substrate and the cover substrate so as to separate a unit structure composed of the lower electrode, the plurality of nanorod-type semiconductor light emitting elements, and the upper electrode, and a phosphor filled in a space defined between the first partition walls.

In addition, the display device may further include each color filter disposed on the cover substrate corresponding to a position of the unit structure, and second partition walls for separating the plurality of color filters from each other.

The plurality of nanorod-type semiconductor light emitting elements may include first nanorod-type semiconductor light emitting elements including non-flat contact surfaces at ends thereof in contact with the upper electrode, and second nanorod-type semiconductor light emitting elements including non-flat contact surfaces at ends thereof in contact with the lower electrodes.

The first and second nanorod-type semiconductor light emitting elements may emit light of different wavelengths.

The display device may further include an additional lower electrode disposed on a top surface of the cover substrate, and a plurality of third nanorod-type semiconductor light emitting elements arranged vertically on the additional lower electrode so as to be spaced apart from each other.

The first to third nanorod-type semiconductor light emitting elements may emit light of wavelengths different from each other.

The third nanorod-type semiconductor light emitting elements may be arranged on the cover substrate corresponding to a separation space defined between the first and second nanorod-type semiconductor light emitting elements.

A method for manufacturing a display device using semiconductor light emitting elements for achieving the above object may include forming a plurality of first nanorod-type semiconductor light emitting elements on a first growing substrate at a predetermined spacing, forming porous structures by etching ends of the first nanorod-type semiconductor light emitting elements connected to the first growing substrate, bringing the first growing substrate into contact with a base substrate having lower electrodes in a grown direction of the first nanorod-type semiconductor light emitting elements, and removing the first growing substrate while the first nanorod-type semiconductor light emitting elements arranged on each lower electrode are separated from the first growing substrate.

Each of the first nanorod-type semiconductor light emitting elements arranged on each lower electrode may be separated from the first growing substrate as one end thereof is bonded to the lower electrode and the porous structure formed at the other end thereof is segmented.

The method may further include forming a plurality of second nanorod-type semiconductor light emitting elements emitting light of a different wavelength on a second growing substrate at a predetermined spacing, forming porous structures by etching ends of the second nanorod-type semiconductor light emitting elements connected to the second growing substrate, bringing the second growing substrate into contact with a cover substrate having upper electrodes in a grown direction of the second nanorod-type semiconductor light emitting elements, removing the second growing substrate while the second nanorod-type semiconductor light emitting elements arranged on each upper electrode are separated from the second growing substrate, additionally forming a lower electrode on the base substrate and additionally forming an upper electrode on the cover substrate, and stacking the cover substrate on the base substrate such that the lower electrodes and the upper electrodes are located at both ends of the first and second semiconductor light emitting elements, respectively.

Advantageous Effects

According to an embodiment of the present disclosure, in the display device using the semiconductor light emitting elements, even when some of the plurality of light emitting elements are defective, there is no problem in driving one pixel, and thus the high yield and the process convenience may be obtained.

In addition, because one pixel region is defined by the electrodes located on the base substrate, there is no need to separately align the semiconductor light emitting elements, so that the high-speed transfer may be achieved.

Furthermore, according to another embodiment of the present disclosure, there are additional effects not mentioned herein. Those of ordinary skill in the art may understand it through the full text of the specification and drawings.

BRIEF DESCRIPTION OF THE DRAWINGS

FIGS. 3A and 3B are cross-sectional diagrams taken along the cutting lines B-B and C-C in FIG. 2;

FIG. 7 is a perspective diagram of a display device using a semiconductor light emitting element according to another embodiment of the present disclosure;

FIG. 8 is a cross-sectional diagram taken along a cutting line D-D shown in FIG. 8;

DETAILED DESCRIPTION

Reference will now be made in detail to embodiments of the present disclosure, examples of which are illustrated in the accompanying drawings. Wherever possible, the same reference numbers will be used throughout the drawings to refer to the same or like parts, and redundant description thereof will be omitted. As used herein, the suffixes "module" and "unit" are added or used interchangeably to facilitate preparation of this specification and are not intended to suggest distinct meanings or functions. In describing embodiments disclosed in this specification, relevant well-known technologies may not be described in detail in order not to obscure the subject matter of the embodiments disclosed in this specification. In addition, it should be noted that the accompanying drawings are only for easy understanding of the embodiments disclosed in the present specification, and should not be construed as limiting the technical spirit disclosed in the present specification.

Furthermore, although the drawings are separately described for simplicity, embodiments implemented by combining at least two or more drawings are also within the scope of the present disclosure.

In addition, when an element such as a layer, region or module is described as being "on" another element, it is to be understood that the element may be directly on the other element or there may be an intermediate element between them.

The display device described herein is a concept including all display devices that display information with a unit pixel or a set of unit pixels. Therefore, the display device may be applied not only to finished products but also to parts. For example, a panel corresponding to a part of a digital TV also independently corresponds to the display device in the present specification. The finished products include a mobile phone, a smartphone, a laptop, a digital broadcasting terminal, a personal digital assistant (PDA), a portable multimedia player (PMP), a navigation system, a slate PC, a tablet, an Ultrabook, a digital TV, a desktop computer, and the like.

However, it will be readily apparent to those skilled in the art that the configuration according to the embodiments described herein is applicable even to a new product that will be developed later as a display device.

In addition, the semiconductor light emitting element mentioned in this specification is a concept including an LED, a micro LED, and the like.

Figure 1:
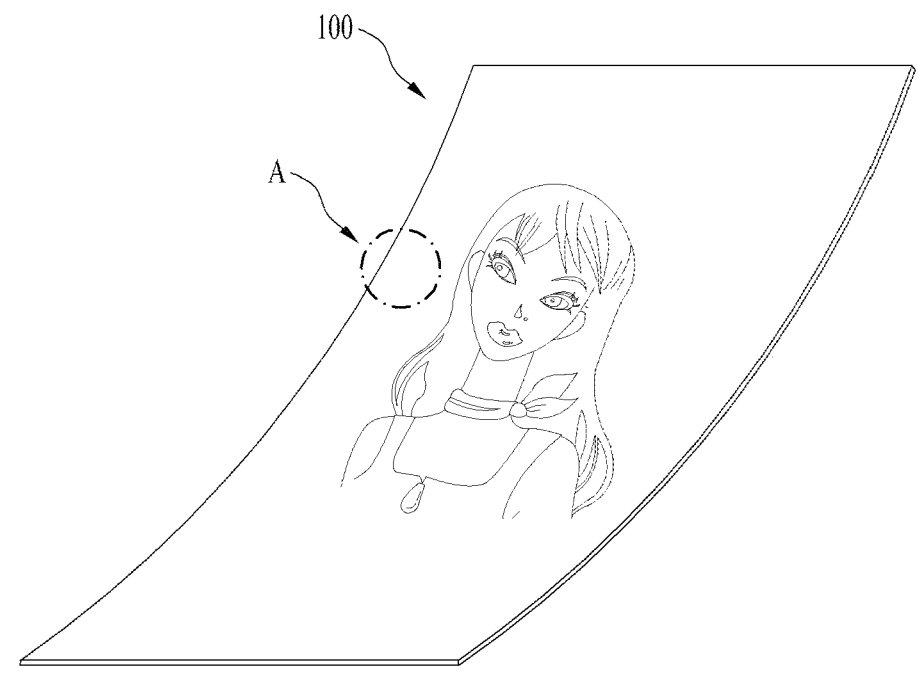
FIG. 1 is a conceptual diagram illustrating an embodiment of a display device using a semiconductor light emitting element according to the present disclosure.

FIG. 1 is a conceptual view illustrating an embodiment of a display device using a semiconductor light emitting element according to the present disclosure.

As shown in FIG. 1, information processed by a controller (not shown) of a display device 100 may be displayed using a flexible display.

The flexible display may include, for example, a display that can be warped, bent, twisted, folded, or rolled by external force.

Furthermore, the flexible display may be, for example, a display manufactured on a thin and flexible substrate that can be warped, bent, folded, or rolled like paper while maintaining the display characteristics of a conventional flat panel display.

When the flexible display remains in an unbent state (e.g., a state having an infinite radius of curvature) (hereinafter referred to as a first state), the display area of the flexible display forms a flat surface. When the display in the first state is changed to a bent state (e.g., a state having a finite radius of curvature) (hereinafter referred to as a second state) by external force, the display area may be a curved surface. As shown in FIG. 1, the information displayed in the second state may be visual information output on a curved surface. Such visual information may be implemented by independently controlling the light emission of sub-pixels arranged in a matrix form. The unit pixel may mean, for example, a minimum unit for implementing one color.

The unit pixel of the flexible display may be implemented by a semiconductor light emitting element. In the present disclosure, a light emitting diode (LED) is exemplified as a type of the semiconductor light emitting element configured to convert electric current into light. The LED may be formed in a small size, and may thus serve as a unit pixel even in the second state.

Hereinafter, a flexible display implemented using the LED will be described in more detail with reference to the drawings.

Figure 2:
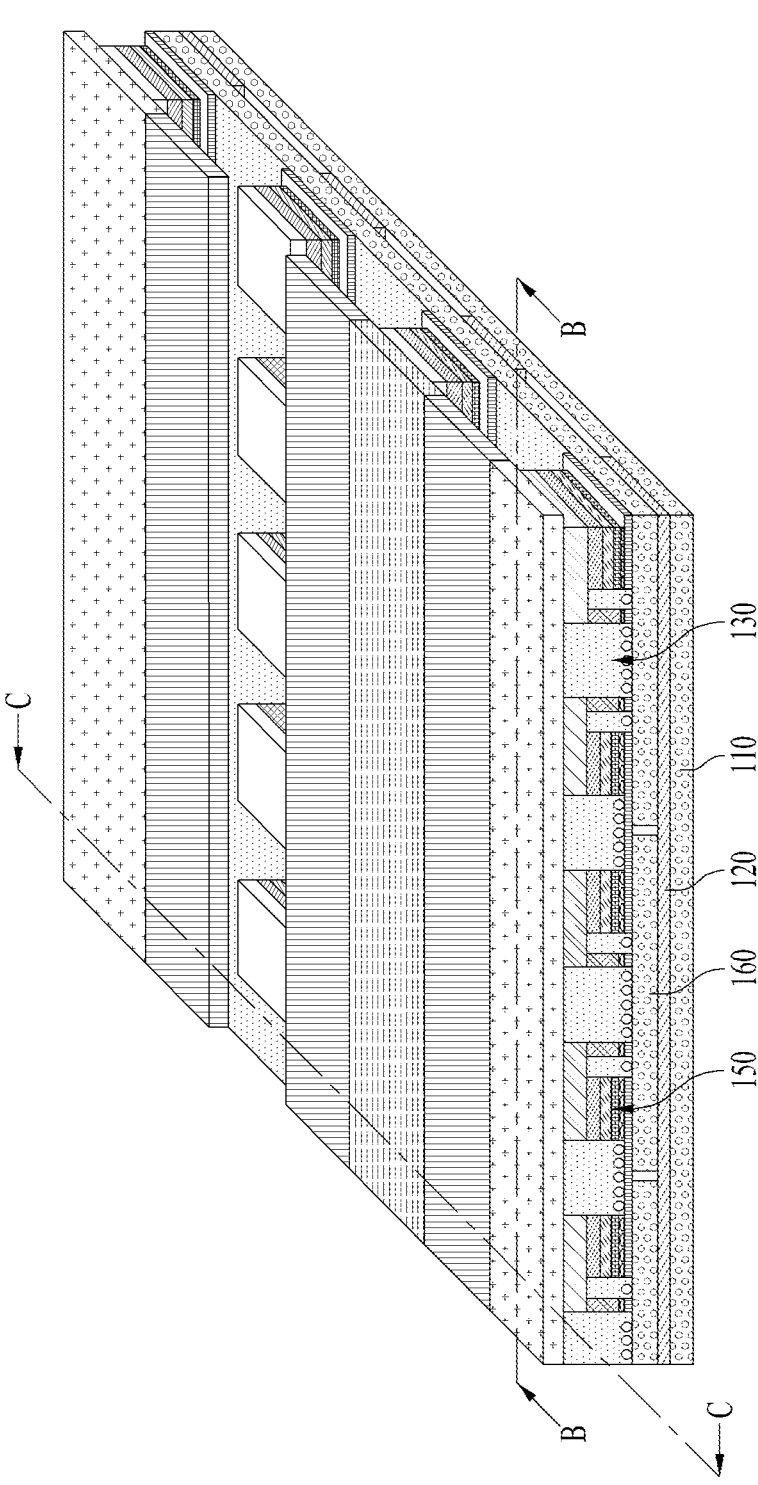
FIG. 2 is a partially enlarged diagram showing a part A shown in FIG. 1.

FIG. 2 is a partially enlarged view showing part A of FIG. 1.

Figure 3A:
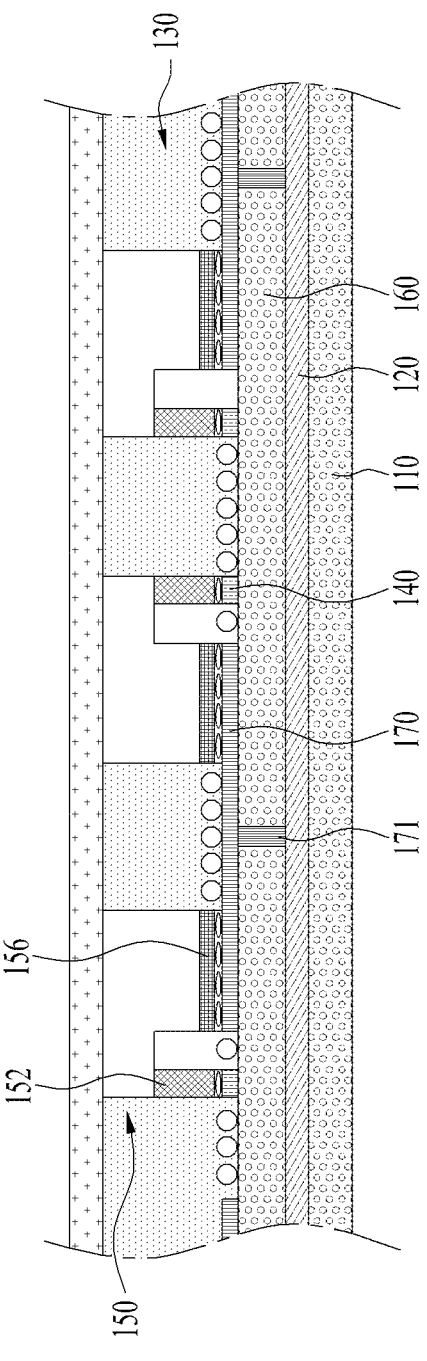
Figure 3B:
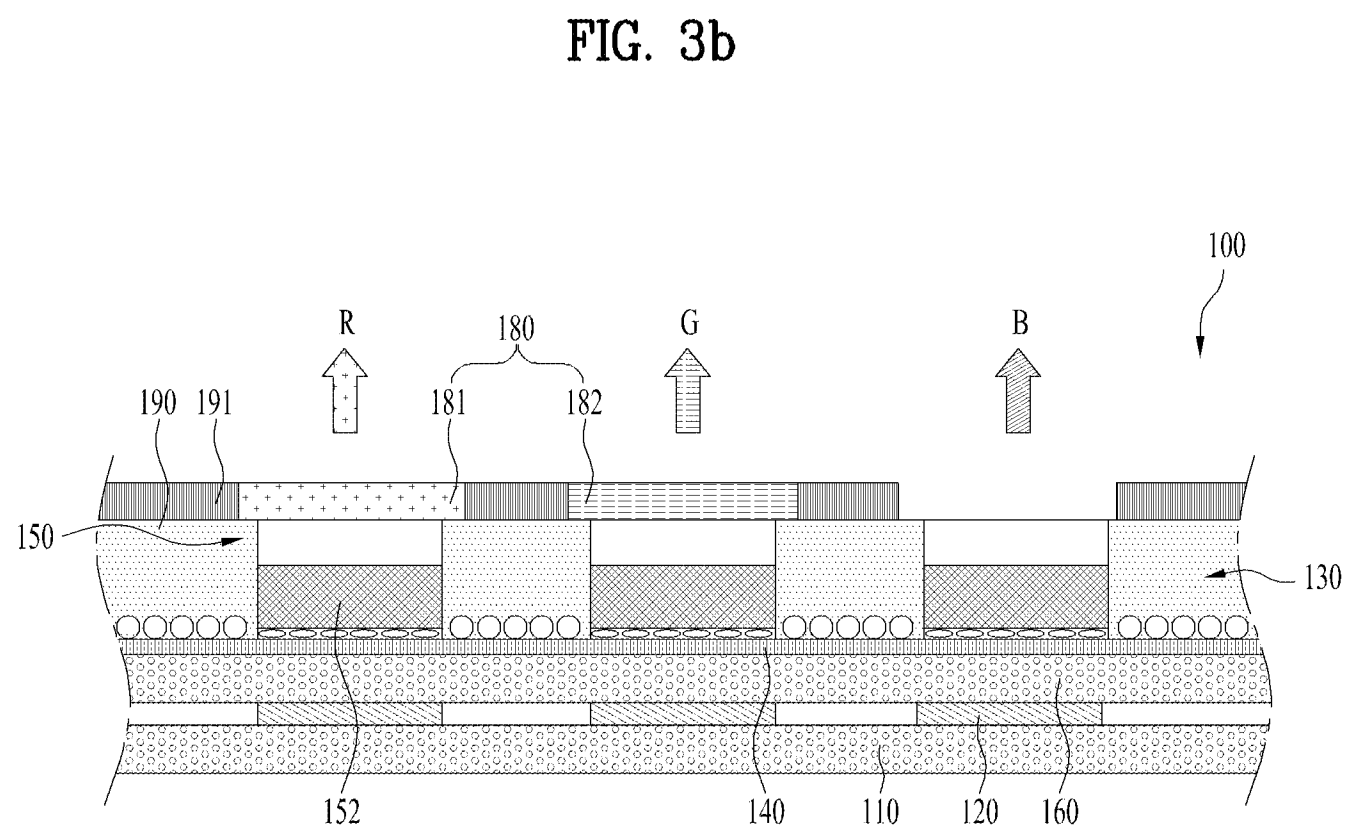

FIGS. 3A and 3B are cross-sectional views taken along lines B-B and C-C in FIG. 2.

Figure 4:
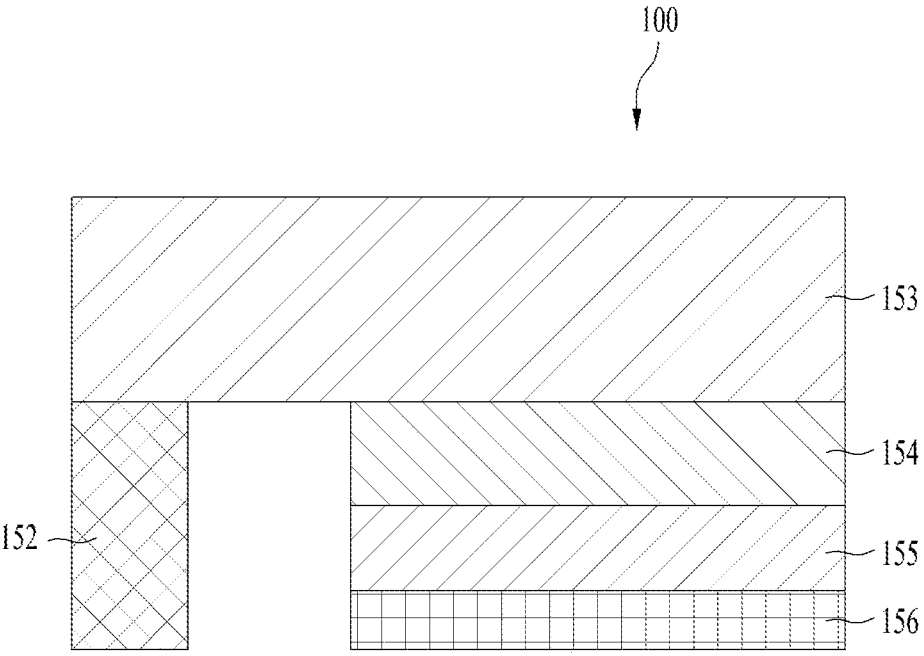
FIG. 4 is a conceptual diagram illustrating the flip-chip type semiconductor light emitting element of FIG. 3.

FIG. 4 is a conceptual view illustrating the flip-chip type semiconductor light emitting element of FIG. 3.

Figure 5A:
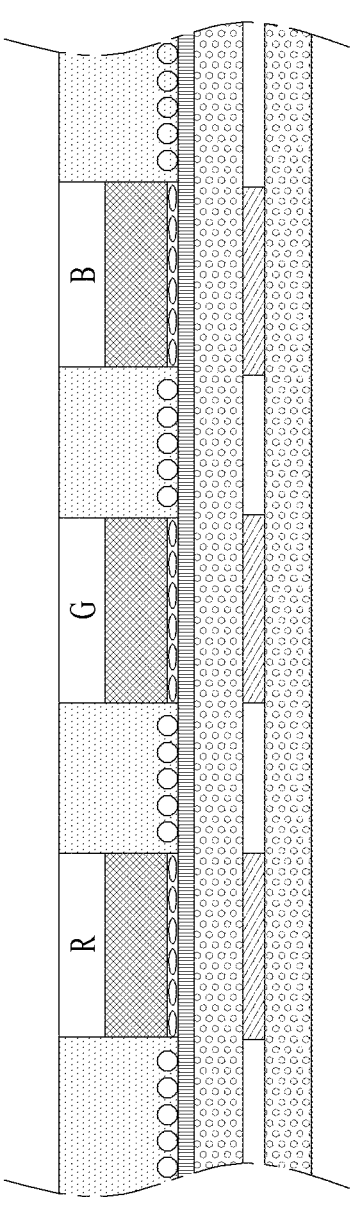
FIGS. 5A to 5C are conceptual diagrams illustrating various examples of color implementation with respect to a flip-chip type semiconductor light emitting element.
Figure 5B:
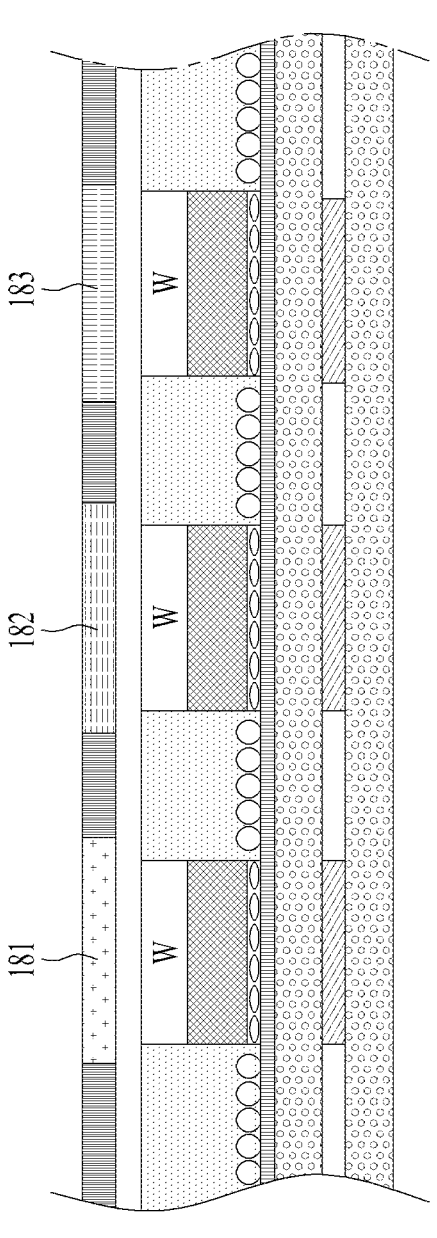
Figure 5C:
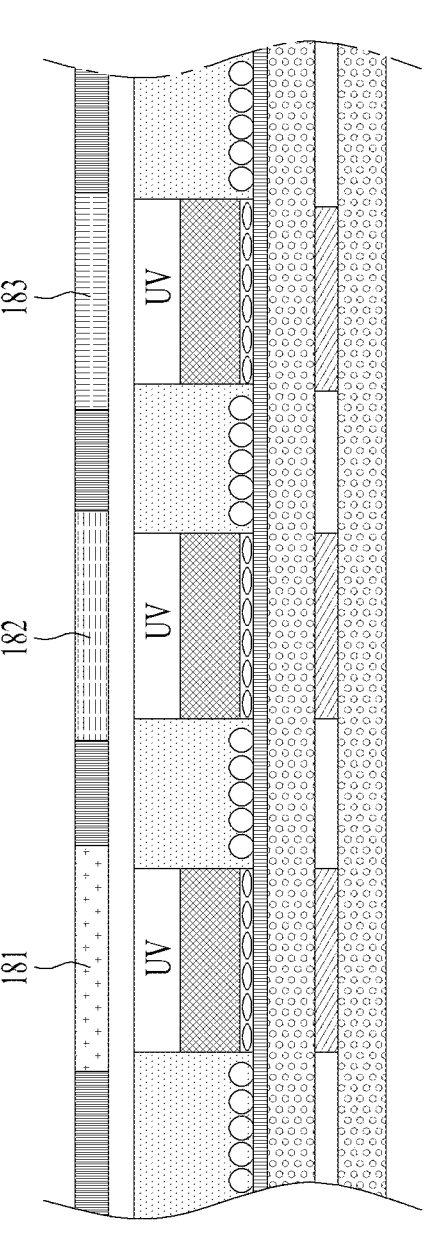

FIGS. 5A to 5C are conceptual views illustrating various examples of implementation of colors in relation to a flip-chip type semiconductor light emitting element.

As shown in FIGS. 2, 3A and 3B, the display device 100 using a passive matrix (PM) type semiconductor light emitting element is exemplified as the display device 100 using a semiconductor light emitting element. However, the examples described below are also applicable to an active matrix (AM) type semiconductor light emitting element.

The display device 100 shown in FIG. 1 may include a substrate 110, a first electrode 120, a conductive adhesive layer 130, a second electrode 140, and at least one semiconductor light emitting element 150, as shown in FIG. 2.

The substrate 110 may be a flexible substrate. For example, to implement a flexible display device, the substrate 110 may include glass or polyimide (PI). Any insulative and flexible material such as polyethylene naphthalate (PEN) or polyethylene terephthalate (PET) may be employed. In addition, the substrate 110 may be formed of either a transparent material or an opaque material.

The substrate 110 may be a wiring substrate on which the first electrode 120 is disposed. Thus, the first electrode 120 may be positioned on the substrate 110.

As shown in FIG. 3A, an insulating layer 160 may be disposed on the substrate 110 on which the first electrode 120 is positioned, and an auxiliary electrode 170 may be positioned on the insulating layer 160. In this case, a stack in which the insulating layer 160 is laminated on the substrate 110 may be a single wiring substrate. More specifically, the insulating layer 160 may be formed of an insulative and flexible material such as PI, PET, or PEN, and may be integrated with the substrate 110 to form a single substrate.

The auxiliary electrode 170, which is an electrode that electrically connects the first electrode 120 and the semiconductor light emitting element 150, is positioned on the insulating layer 160, and is disposed to correspond to the position of the first electrode 120. For example, the auxiliary electrode 170 may have a dot shape and may be electrically connected to the first electrode 120 by an electrode hole 171 formed through the insulating layer 160. The electrode hole 171 may be formed by filling a via hole with a conductive material.

As shown in FIG. 2 or 3A, a conductive adhesive layer 130 may be formed on one surface of the insulating layer 160, but embodiments of the present disclosure are not limited thereto. For example, a layer performing a specific function may be formed between the insulating layer 160 and the conductive adhesive layer 130, or the conductive adhesive layer 130 may be disposed on the substrate 110 without the insulating layer 160. In a structure in which the conductive adhesive layer 130 is disposed on the substrate 110, the conductive adhesive layer 130 may serve as an insulating layer.

The conductive adhesive layer 130 may be a layer having adhesiveness and conductivity. For this purpose, a material having conductivity and a material having adhesiveness may be mixed in the conductive adhesive layer 130. In addition, the conductive adhesive layer 130 may have ductility, thereby providing making the display device flexible.

As an example, the conductive adhesive layer 130 may be an anisotropic conductive film (ACF), an anisotropic conductive paste, a solution containing conductive particles, or the like. The conductive adhesive layer 130 may be configured as a layer that allows electrical interconnection in the direction of the Z-axis extending through the thickness, but is electrically insulative in the horizontal X-Y direction. Accordingly, the conductive adhesive layer 130 may be referred to as a Z-axis conductive layer (hereinafter, referred to simply as a "conductive adhesive layer").

The ACF is a film in which an anisotropic conductive medium is mixed with an insulating base member. When the ACF is subjected to heat and pressure, only a specific portion thereof becomes conductive by the anisotropic conductive medium. Hereinafter, it will be described that heat and pressure are applied to the ACF. However, another method may be used to make the ACF partially conductive. The other method may be, for example, application of only one of the heat and pressure or UV curing.

In addition, the anisotropic conductive medium may be, for example, conductive balls or conductive particles. For example, the ACF may be a film in which conductive balls are mixed with an insulating base member. Thus, when heat and pressure are applied to the ACF, only a specific portion of the ACF is allowed to be conductive by the conductive balls. The ACF may contain a plurality of particles formed by coating the core of a conductive material with an insulating film made of a polymer material. In this case, as the insulating film is destroyed in a portion to which heat and pressure are applied, the portion is made to be conductive by the core. At this time, the cores may be deformed to form layers that contact each other in the thickness direction of the film. As a more specific example, heat and pressure are applied to the whole ACF, and an electrical connection in the Z-axis direction is partially formed by the height difference of a counterpart adhered by the ACF.

As another example, the ACF may contain a plurality of particles formed by coating an insulating core with a conductive material. In this case, as the conductive material is deformed (pressed) in a portion to which heat and pressure are applied, the portion is made to be conductive in the thickness direction of the film. As another example, the conductive material may be disposed through the insulating base member in the Z-axis direction to provide conductivity in the thickness direction of the film. In this case, the conductive material may have a pointed end.

The ACF may be a fixed array ACF in which conductive balls are inserted into one surface of the insulating base member. More specifically, the insulating base member may be formed of an adhesive material, and the conductive balls may be intensively disposed on the bottom portion of the insulating base member. Thus, when the base member is subjected to heat and pressure, it may be deformed together with the conductive balls, exhibiting conductivity in the vertical direction.

However, the present disclosure is not necessarily limited thereto, and the ACF may be formed by randomly mixing conductive balls in the insulating base member, or may be composed of a plurality of layers with conductive balls arranged on one of the layers (as a double-ACF).

The anisotropic conductive paste may be a combination of a paste and conductive balls, and may be a paste in which conductive balls are mixed with an insulating and adhesive base material. Also, the solution containing conductive particles may be a solution containing any conductive particles or nanoparticles.

Referring back to FIG. 3A, the second electrode 140 is positioned on the insulating layer 160 and spaced apart from the auxiliary electrode 170. That is, the conductive adhesive layer 130 is disposed on the insulating layer 160 having the auxiliary electrode 170 and the second electrode 140 positioned thereon.

After the conductive adhesive layer 130 is formed with the auxiliary electrode 170 and the second electrode 140 positioned on the insulating layer 160, the semiconductor light emitting element 150 is connected thereto in a flip-chip form by applying heat and pressure. Thereby, the semiconductor light emitting element 150 is electrically connected to the first electrode 120 and the second electrode 140.

Referring to FIG. 4, the semiconductor light emitting element may be a flip chip-type light emitting device.

For example, the semiconductor light emitting element may include a p-type electrode 156, a p-type semiconductor layer 155 on which the p-type electrode 156 is formed, an active layer 154 formed on the p-type semiconductor layer 155, an n-type semiconductor layer 153 formed on the active layer 154, and an n-type electrode 152 disposed on the n-type semiconductor layer 153 and horizontally spaced apart from the p-type electrode 156. In this case, the p-type electrode 156 may be electrically connected to the auxiliary electrode 170, which is shown in FIG. 3, by the conductive adhesive layer 130, and the n-type electrode 152 may be electrically connected to the second electrode 140.

Referring back to FIGS. 2, 3A and 3B, the auxiliary electrode 170 may be elongated in one direction. Thus, one auxiliary electrode may be electrically connected to the plurality of semiconductor light emitting elements 150. For example, p-type electrodes of semiconductor light emitting elements on left and right sides of an auxiliary electrode may be electrically connected to one auxiliary electrode.

More specifically, the semiconductor light emitting element 150 may be press-fitted into the conductive adhesive layer 130 by heat and pressure. Thereby, only the portions of the semiconductor light emitting element 150 between the p-type electrode 156 and the auxiliary electrode 170 and between the n-type electrode 152 and the second electrode 140 may exhibit conductivity, and the other portions of the semiconductor light emitting element 150 do not exhibit conductivity as they are not press-fitted. In this way, the conductive adhesive layer 130 interconnects and electrically connects the semiconductor light emitting element 150 and the auxiliary electrode 170 and interconnects and electrically connects the semiconductor light emitting element 150 and the second electrode 140.

The plurality of semiconductor light emitting elements 150 may constitute a light emitting device array, and a phosphor conversion layer 180 may be formed on the light emitting device array.

The light emitting device array may include a plurality of semiconductor light emitting elements having different luminance values. Each semiconductor light emitting element 150 may constitute a unit pixel and may be electrically connected to the first electrode 120. For example, a plurality of first electrodes 120 may be provided, and the semiconductor light emitting elements may be arranged in, for example, several columns. The semiconductor light emitting elements in each column may be electrically connected to any one of the plurality of first electrodes.

In addition, since the semiconductor light emitting elements are connected in a flip-chip form, semiconductor light emitting elements grown on a transparent dielectric substrate may be used. The semiconductor light emitting elements may be, for example, nitride semiconductor light emitting elements. Since the semiconductor light emitting element 150 has excellent luminance, it may constitute an individual unit pixel even when it has a small size.

As shown in FIG. 3, a partition wall 190 may be formed between the semiconductor light emitting elements 150. In this case, the partition wall 190 may serve to separate individual unit pixels from each other, and may be integrated with the conductive adhesive layer 130. For example, by inserting the semiconductor light emitting element 150 into the ACF, the base member of the ACF may form the partition wall.

In addition, when the base member of the ACF is black, the partition wall 190 may have reflectance and increase contrast even without a separate black insulator.

As another example, a reflective partition wall may be separately provided as the partition wall 190. In this case, the partition wall 190 may include a black or white insulator depending on the purpose of the display device. When a partition wall including a white insulator is used, reflectivity may be increased. When a partition wall including a black insulator is used, it may have reflectance and increase contrast.

The phosphor conversion layer 180 may be positioned on the outer surface of the semiconductor light emitting element 150. For example, the semiconductor light emitting element 150 may be a blue semiconductor light emitting element that emits blue (B) light, and the phosphor conversion layer 180 may function to convert the blue (B) light into a color of a unit pixel. The phosphor conversion layer 180 may be a red phosphor 181 or a green phosphor 182 constituting an individual pixel.

That is, the red phosphor 181 capable of converting blue light into red (R) light may be laminated on a blue semiconductor light emitting element at a position of a unit pixel of red color, and the green phosphor 182 capable of converting blue light into green (G) light may be laminated on the blue semiconductor light emitting element at a position of a unit pixel of green color. Only the blue semiconductor light emitting element may be used alone in the portion constituting the unit pixel of blue color. In this case, unit pixels of red (R), green (G), and blue (B) may constitute one pixel. More specifically, a phosphor of one color may be laminated along each line of the first electrode 120. Accordingly, one line on the first electrode 120 may be an electrode for controlling one color. That is, red (R), green (G), and blue (B) may be sequentially disposed along the second electrode 140, thereby implementing a unit pixel.

However, embodiments of the present disclosure are not limited thereto. Unit pixels of red (R), green (G), and blue (B) may be implemented by combining the semiconductor light emitting element 150 and the quantum dot (QD) rather than using the phosphor.

Also, a black matrix 191 may be disposed between the phosphor conversion layers to improve contrast. That is, the black matrix 191 may improve contrast of light and darkness.

However, embodiments of the present disclosure are not limited thereto, and anther structure may be applied to implement blue, red, and green colors.

Referring to FIG. 5A, each semiconductor light emitting element may be implemented as a high-power light emitting device emitting light of various colors including blue by using gallium nitride (GaN) as a main material and adding indium (In) and/or aluminum (Al).

In this case, each semiconductor light emitting element may be a red, green, or blue semiconductor light emitting element to form a unit pixel (sub-pixel). For example, red, green, and blue semiconductor light emitting elements R, G, and B may be alternately disposed, and unit pixels of red, green, and blue may constitute one pixel by the red, green and blue semiconductor light emitting elements. Thereby, a full-color display may be implemented.

Referring to FIG. 5B, the semiconductor light emitting element 150a may include a white light emitting device W having a yellow phosphor conversion layer, which is provided for each device. In this case, in order to form a unit pixel, a red phosphor conversion layer 181, a green phosphor conversion layer 182, and a blue phosphor conversion layer 183 may be disposed on the white light emitting device W. In addition, a unit pixel may be formed using a color filter repeating red, green, and blue on the white light emitting device W.

Referring to FIG. 5C, a red phosphor conversion layer 181, a green phosphor conversion layer 185, and a blue phosphor conversion layer 183 may be provided on a ultraviolet light emitting device. Not only visible light but also ultraviolet (UV) light may be used in the entire region of the semiconductor light emitting element. In an embodiment, UV may be used as an excitation source of the upper phosphor in the semiconductor light emitting element.

Referring back to this example, the semiconductor light emitting element is positioned on the conductive adhesive layer to constitute a unit pixel in the display device. Since the semiconductor light emitting element has excellent luminance, individual unit pixels may be configured despite even when the semiconductor light emitting element has a small size.

Regarding the size of such an individual semiconductor light emitting element, the length of each side of the device may be, for example, 80 μm or less, and the device may have a rectangular or square shape. When the semiconductor light emitting element has a rectangular shape, the size thereof may be less than or equal to 20 μm×80 μm.

In addition, even when a square semiconductor light emitting element having a side length of 10 μm is used as a unit pixel, sufficient brightness to form a display device may be obtained.

Therefore, for example, in case of a rectangular pixel having a unit pixel size of 600 μm×300 μm (i.e., one side by the other side), a distance of a semiconductor light emitting element becomes sufficiently long relatively.

Thus, in this case, it is able to implement a flexible display device having high image quality over HD image quality.

The above-described display device using the semiconductor light emitting element may be prepared by a new fabricating method. Such a fabricating method will be described with reference to FIG. 6 as follows.

Figure 6:
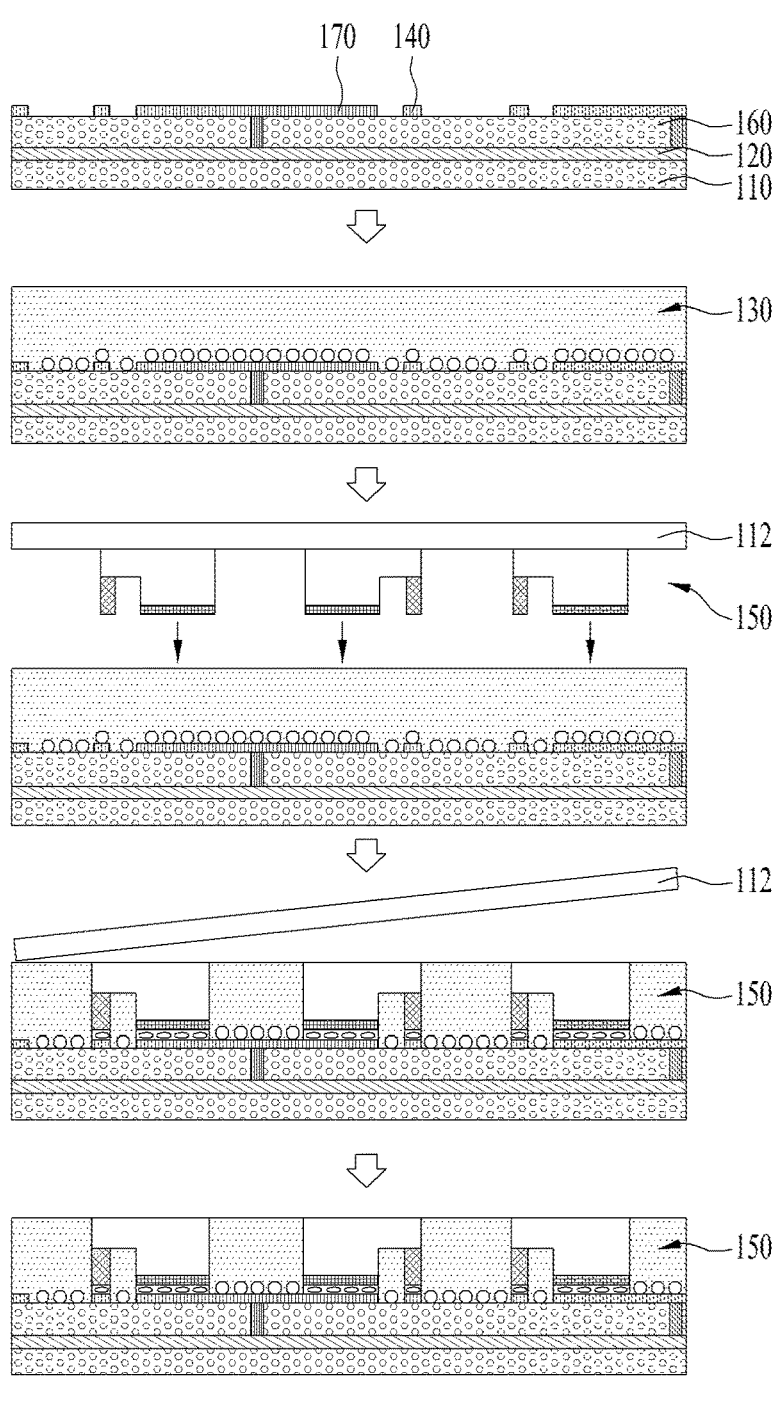
FIG. 6 shows cross-sectional views of a method of fabricating a display device using a semiconductor light emitting element according to the present disclosure.

FIG. 6 shows cross-sectional views of a method of fabricating a display device using a semiconductor light emitting element according to the present disclosure.

Referring to FIG. 6, first of all, a conductive adhesive layer 130 is formed on an insulating layer 160 located between an auxiliary electrode 170 and a second electrode 140. The insulating layer 160 is tacked on a wiring substrate 110. On the wiring substrate 110, a first electrode 120, the auxiliary electrode 170 and the second electrode 140 are disposed. In this case, the first electrode 120 and the second electrode 140 may be disposed in mutually orthogonal directions, respectively. In order to implement a flexible display device, the wiring substrate 110 and the insulating layer 160 may include glass or polyimide (PI) each.

For example, the conductive adhesive layer 130 may be implemented by an anisotropic conductive film. To this end, an anisotropic conductive film may be coated on the substrate on which the insulating layer 160 is located.

Subsequently, a temporary substrate 112, on which a plurality of semiconductor light emitting elements 150 configuring individual pixels are located to correspond to locations of the auxiliary electrode 170 and the second electrodes 140, is disposed in a manner that the semiconductor light emitting element 150 confronts the auxiliary electrode 170 and the second electrode 140.

In this regard, the temporary 112 substrate 112 is a growing substrate for growing the semiconductor light emitting element 150 and may include a sapphire or silicon substrate.

The semiconductor light emitting element is configured to have a space and size for configuring a display device when formed in unit of wafer, thereby being effectively used for the display device.

Subsequently, the wiring substrate 110 and the temporary substrate 112 are thermally compressed together. By the thermocompression, the wiring substrate 110 and the temporary substrate 112 are bonded together. Owing to the property of an anisotropic conductive film having conductivity by thermocompression, only a portion among the semiconductor light emitting element 150, the auxiliary electrode 170 and the second electrode 140 has conductivity, via which the electrodes and the semiconductor light emitting element 150 may be connected electrically. In this case, the semiconductor light emitting element 150 is inserted into the anisotropic conductive film, by which a partition may be formed between the semiconductor light emitting elements 150.

Then the temporary substrate 112 is removed. For example, the temporary substrate 112 may be removed using Laser Lift-Off (LLO) or Chemical Lift-Off (CLO).

Finally, by removing the temporary substrate 112, the semiconductor light emitting elements 150 exposed externally. If necessary, the wiring substrate 110 to which semiconductor light emitting elements 150 are coupled may be coated with silicon oxide (SiOx) or the like to form a transparent insulating layer (not shown).

In addition, a step of forming a phosphor layer on one side of the semiconductor light emitting element 150 may be further included. For example, the semiconductor light emitting element 150 may include a blue semiconductor light emitting element emitting Blue (B) light, and a red or green phosphor for converting the blue (B) light into a color of a unit pixel may form a layer on one side of the blue semiconductor light emitting element.

The above-described fabricating method or structure of the display device using the semiconductor light emitting element may be modified into various forms. For example, the above-described display device may employ a vertical semiconductor light emitting element.

Furthermore, a modification or embodiment described in the following may use the same or similar reference numbers for the same or similar configurations of the former example and the former description may apply thereto.

Figure 7:
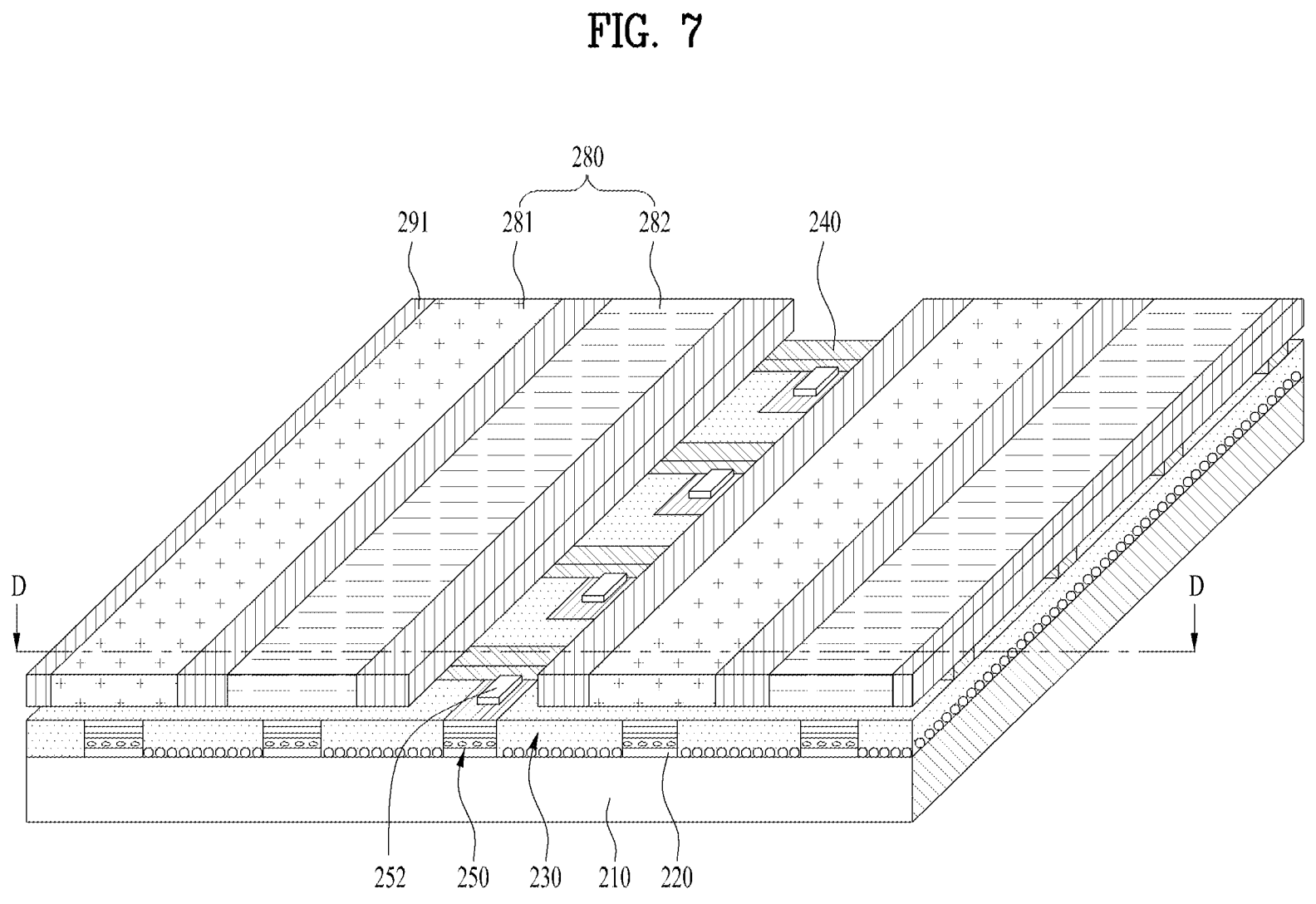
Figure 8:
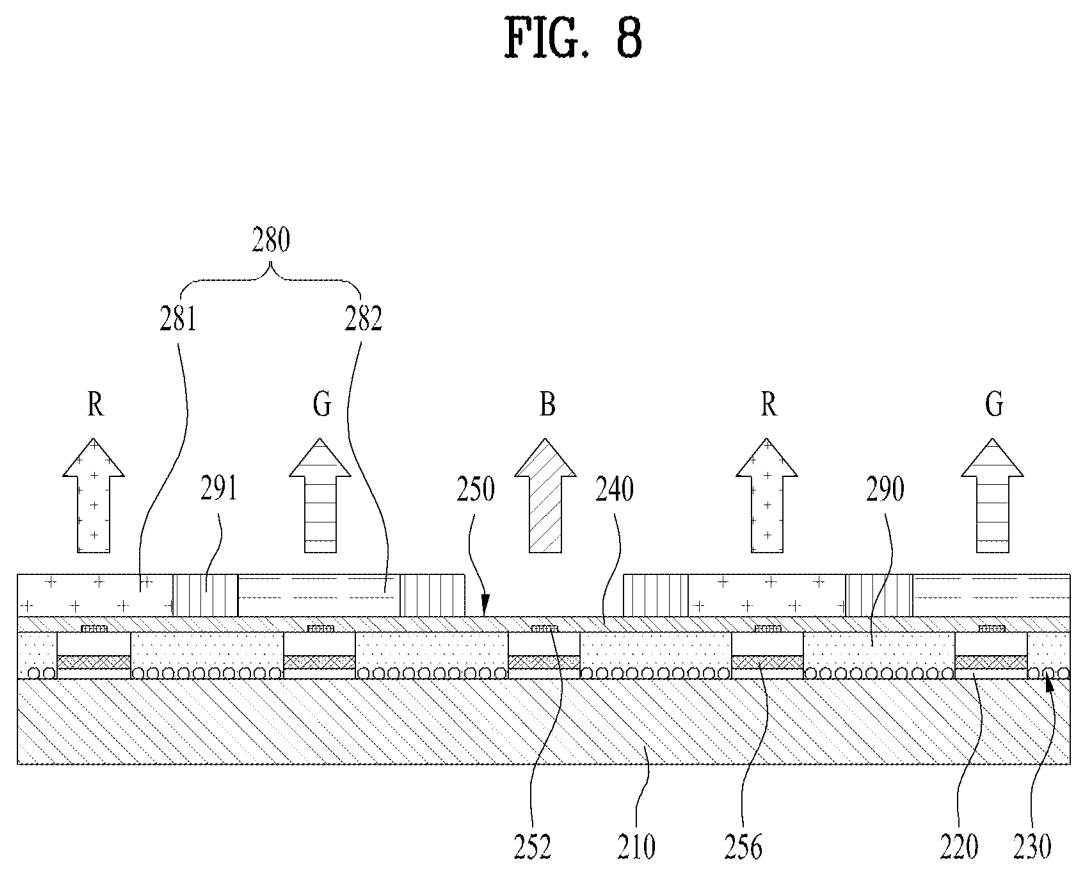
Figure 9:
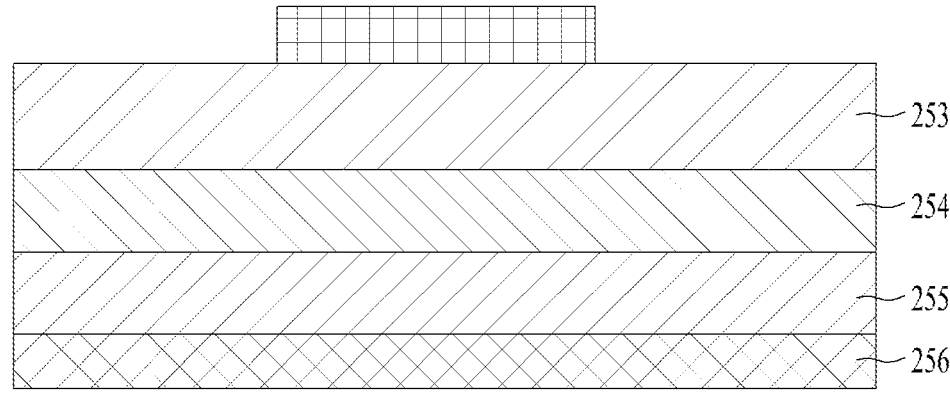
FIG. 9 is a conceptual diagram showing a vertical type semiconductor light emitting element shown in FIG. 8.

FIG. 7 is a perspective diagram of a display device using a semiconductor light emitting element according to another embodiment of the present disclosure, FIG. 8 is a cross-sectional diagram taken along a cutting line D-D shown in FIG. 8, and FIG. 9 is a conceptual diagram showing a vertical type semiconductor light emitting element shown in FIG. 8.

Referring to the present drawings, a display device may employ a vertical semiconductor light emitting device of a Passive Matrix (PM) type.

The display device includes a substrate 210, a first electrode 220, a conductive adhesive layer 230, a second electrode 240 and at least one semiconductor light emitting element 250.

The substrate 210 is a wiring substrate on which the first electrode 220 is disposed and may contain polyimide (PI) to implement a flexible display device. Besides, the substrate 210 may use any substance that is insulating and flexible.

The first electrode 210 is located on the substrate 210 and may be formed as a bar type electrode that is long in one direction. The first electrode 220 may be configured to play a role as a data electrode.

The conductive adhesive layer 230 is formed on the substrate 210 where the first electrode 220 is located. Like a display device to which a light emitting device of a flip chip type is applied, the conductive adhesive layer 230 may include one of an Anisotropic Conductive Film (ACF), an anisotropic conductive paste, a conductive particle contained solution and the like. Yet, in the present embodiment, a case of implementing the conductive adhesive layer 230 with the anisotropic conductive film is exemplified.

After the conductive adhesive layer has been placed in the state that the first electrode 220 is located on the substrate 210, if the semiconductor light emitting element 250 is connected by applying heat and pressure thereto, the semiconductor light emitting element 250 is electrically connected to the first electrode 220. In doing so, the semiconductor light emitting element 250 is preferably disposed to be located on the first electrode 220.

If heat and pressure is applied to an anisotropic conductive film, as described above, since the anisotropic conductive film has conductivity partially in a thickness direction, the electrical connection is established. Therefore, the anisotropic conductive film is partitioned into a conductive portion and a non-conductive portion.

Furthermore, since the anisotropic conductive film contains an adhesive component, the conductive adhesive layer 230 implements mechanical coupling between the semiconductor light emitting element 250 and the first electrode 220 as well as mechanical connection.

Thus, the semiconductor light emitting element 250 is located on the conductive adhesive layer 230, via which an individual pixel is configured in the display device. As the semiconductor light emitting element 250 has excellent luminance, an individual unit pixel may be configured in small size as well. Regarding a size of the individual semiconductor light emitting element 250, a length of one side may be equal to or smaller than 80 μm for example and the individual semiconductor light emitting element 250 may include a rectangular or square element. For example, the rectangular element may have a size equal to or smaller than 20 μm×80 μm.

The semiconductor light emitting element 250 may have a vertical structure.

Among the vertical type semiconductor light emitting elements, a plurality of second electrodes 240 respectively and electrically connected to the vertical type semiconductor light emitting elements 250 are located in a manner of being disposed in a direction crossing with a length direction of the first electrode 220.

Referring to FIG. 9, the vertical type semiconductor light emitting element 250 includes a p-type electrode 256, a p-type semiconductor layer 255 formed on the p-type electrode 256, an active layer 254 formed on the p-type semiconductor layer 255, an n-type semiconductor layer 253 formed on the active layer 254, and an n-type electrode 252 formed on then-type semiconductor layer 253. In this case, the p-type electrode 256 located on a bottom side may be electrically connected to the first electrode 220 by the conductive adhesive layer 230, and the n-type electrode 252 located on a top side may be electrically connected to a second electrode 240 described later. Since such a vertical type semiconductor light emitting element 250 can dispose the electrodes at top and bottom, it is considerably advantageous in reducing a chip size.

Referring to FIG. 8 again, a phosphor layer 280 may formed on one side of the semiconductor light emitting element 250. For example, the semiconductor light emitting element 250 may include a blue semiconductor light emitting element 251 emitting blue (B) light, and a phosphor layer 280 for converting the blue (B) light into a color of a unit pixel may be provided. In this regard, the phosphor layer 280 may include a red phosphor 281 and a green phosphor 282 configuring an individual pixel.

Namely, at a location of configuring a red unit pixel, the red phosphor 281 capable of converting blue light into red (R) light may be stacked on a blue semiconductor light emitting element. At a location of configuring a green unit pixel, the green phosphor 282 capable of converting blue light into green (G) light may be stacked on the blue semiconductor light emitting element. Moreover, the blue semiconductor light emitting element may be singly usable for a portion that configures a blue unit pixel. In this case, the unit pixels of red (R), green (G) and blue (B) may configure a single pixel.

Yet, the present disclosure is non-limited by the above description. In a display device to which a light emitting element of a flip chip type is applied, as described above, a different structure for implementing blue, red and green may be applicable.

Regarding the present embodiment again, the second electrode 240 is located between the semiconductor light emitting elements 250 and connected to the semiconductor light emitting elements electrically. For example, the semiconductor light emitting elements 250 are disposed in a plurality of columns, and the second electrode 240 may be located between the columns of the semiconductor light emitting elements 250.

Since a distance between the semiconductor light emitting elements 250 configuring the individual pixel is sufficiently long, the second electrode 240 may be located between the semiconductor light emitting elements 250.

The second electrode 240 may be formed as an electrode of a bar type that is long in one direction and disposed in a direction vertical to the first electrode.

In addition, the second electrode 240 and the semiconductor light emitting element 250 may be electrically connected to each other by a connecting electrode protruding from the second electrode 240. Particularly, the connecting electrode may include a n-type electrode of the semiconductor light emitting element 250. For example, the n-type electrode is formed as an ohmic electrode for ohmic contact, and the second electrode covers at least one portion of the ohmic electrode by printing or deposition. Thus, the second electrode 240 and the n-type electrode of the semiconductor light emitting element 250 may be electrically connected to each other.

Referring to FIG. 8 again, the second electrode 240 may be located on the conductive adhesive layer 230. In some cases, a transparent insulating layer (not shown) containing silicon oxide (SiOx) and the like may be formed on the substrate 210 having the semiconductor light emitting element 250 formed thereon. If the second electrode 240 is placed after the transparent insulating layer has been formed, the second electrode 240 is located on the transparent insulating layer. Alternatively, the second electrode 240 may be formed in a manner of being spaced apart from the conductive adhesive layer 230 or the transparent insulating layer.

If a transparent electrode of Indium Tin Oxide (ITO) or the like is sued to place the second electrode 240 on the semiconductor light emitting element 250, there is a problem that ITO substance has poor adhesiveness to an n-type semiconductor layer. Therefore, according to the present disclosure, as the second electrode 240 is placed between the semiconductor light emitting elements 250, it is advantageous in that a transparent electrode of ITO is not used. Thus, light extraction efficiency can be improved using a conductive substance having good adhesiveness to an n-type semiconductor layer as a horizontal electrode without restriction on transparent substance selection.

Referring to FIG. 8 again, a partition 290 may be located between the semiconductor light emitting elements 250. Namely, in order to isolate the semiconductor light emitting element 250 configuring the individual pixel, the partition 290 may be disposed between the vertical type semiconductor light emitting elements 250. In this case, the partition 290 may play a role in separating the individual unit pixels from each other and be formed with the conductive adhesive layer 230 as an integral part. For example, by inserting the semiconductor light emitting element 250 in an anisotropic conductive film, a base member of the anisotropic conductive film may form the partition.

In addition, if the base member of the anisotropic conductive film is black, the partition 290 may have reflective property as well as a contrast ratio may be increased, without a separate block insulator.

For another example, a reflective partition may be separately provided as the partition 190. The partition 290 may include a black or white insulator depending on the purpose of the display device.

In case that the second electrode 240 is located right onto the conductive adhesive layer 230 between the semiconductor light emitting elements 250, the partition 290 may be located between the vertical type semiconductor light emitting element 250 and the second electrode 240 each. Therefore, an individual unit pixel may be configured using the semiconductor light emitting element 250. Since a distance between the semiconductor light emitting elements 250 is sufficiently long, the second electrode 240 can be placed between the semiconductor light emitting elements 250. And, it may bring an effect of implementing a flexible display device having HD image quality.

In addition, as shown in FIG. 8, a black matrix 291 may be disposed between the respective phosphors for the contrast ratio improvement. Namely, the black matrix 291 may improve the contrast between light and shade.

Figure 10:
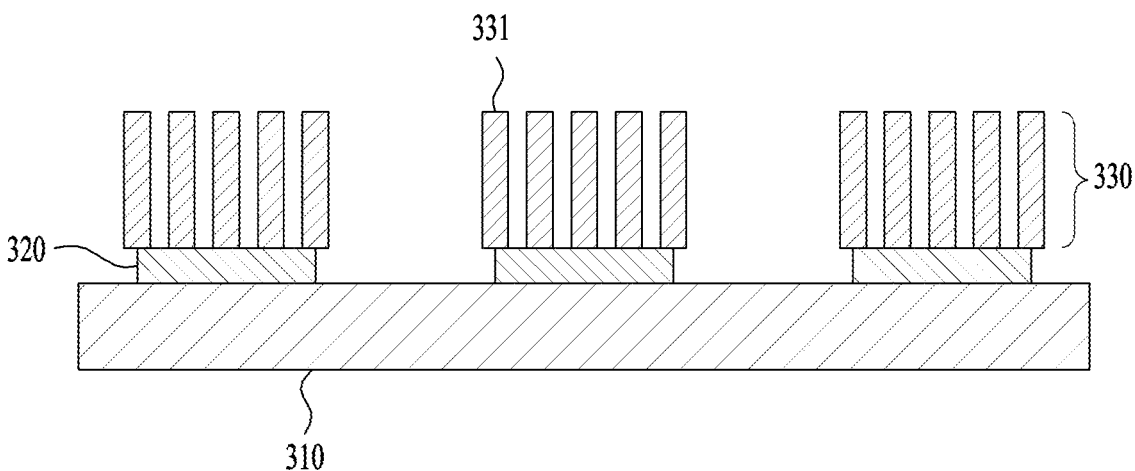
FIG. 10 is a view showing a base substrate including nanorod-type semiconductor light emitting elements.

FIG. 10 is a view showing a base substrate including nanorod-type semiconductor light emitting elements.

A display device according to one embodiment may include a wiring substrate 310, lower electrodes 320 arranged on the wiring substrate 310, and semiconductor light emitting elements 330 arranged on each lower electrode.

The wiring substrate 310 may be a substrate including a printed circuit that applies an electrical signal to the semiconductor light emitting elements 330. Specifically, the wiring substrate 310 may correspond to the substrate 110 described above. The lower electrodes 320, as a component connected to circuit wiring of the wiring substrate 310, may correspond to the first electrode 120 and the second electrode 140 described in FIG. 2.

The semiconductor light emitting elements 330 may include a plurality of nanorod-type semiconductor light emitting elements 331. The nanorod-type semiconductor light emitting element 331 is a semiconductor light emitting element 331 having a nano-unit width and a micro-unit length, and is a light emitting element in which a plurality of semiconductor layers are stacked in a longitudinal direction. The nanorod shape 331 may have a cross-section in various shapes, such as a circular shape or a polygonal shape such as a quadrangle. Such semiconductor light emitting element 330 may be formed by sequentially growing a first conductivity-type nanorod-type semiconductor, a multi quantum well, and a second conductivity-type nanorod-type semiconductor on a growing substrate. In addition, such semiconductor light emitting element 330 may be formed by performing etching in a longitudinal direction using a mask via a lithography process.

The first conductivity-type semiconductor and the second conductivity-type semiconductor may mean an n-type semiconductor and a p-type semiconductor, respectively, or may mean the p-type semiconductor and the n-type semiconductor, respectively.

The longitudinal direction of such nanorod-type semiconductor light emitting element 330 may not be parallel to the wiring substrate 310. Furthermore, the nanorod-type semiconductor light emitting elements 330 may be vertically arranged with respect to the wiring substrate 310. Specifically, the plurality of nanorod-type semiconductor light emitting elements 330 may be vertically arranged on each lower electrode 320 while being spaced apart from each other.

By vertically arranging the nanorod-type semiconductor light emitting elements 330 on the wiring substrate 310, a wider active or accommodating area resulted from a three-dimensional structure may be secured compared to semiconductor light emitting elements that are in a planar type, not in the nanorod type, or semiconductor light emitting elements that are not vertically arranged, and an optical waveguide effect using a difference in refractive index between a semiconductor and a surrounding material may be obtained.

Furthermore, by vertically arranging the nanorod-type semiconductor light emitting elements 330 on the wiring substrate 310, a degree of integration is improved because of a narrow cross-sectional area and the three-dimensional structure.

The lower electrode 320 is disposed to be connected to the circuit wiring printed on the wiring substrate 310 to fix the nanorod-type semiconductor light emitting elements 330 on the wiring substrate 310.

Because the display device according to one embodiment of the present disclosure includes the plurality of nanorod-type semiconductor light emitting elements 330 to define one pixel, even when some of the plurality of nanorod-type semiconductor light emitting elements 330 are defective, the pixel may be normally driven.

Therefore, because a process of inspecting, removing, and repairing the defective light emitting element may be omitted, when manufacturing the display device including the semiconductor light emitting element, the manufacturing may be achieved within a short time with high yield and low cost.

In the process of manufacturing the display device including such semiconductor light emitting elements, a transfer process in which the semiconductor light emitting elements are separated from the growing substrate and transferred to a base substrate is inevitably accompanied.

In such transfer process, the separation of the light emitting elements is generally achieved using a laser lift-off (LLO) process. In this regard, the LLO scheme is a scheme of separating the light emitting elements from the growing substrate using a laser. For example, the LLO scheme means separation of the light emitting elements performed as deformation occurs inside a GaN layer, which is made of a material that absorbs a laser beam.

However, when the LLO scheme is used, there is a high risk of damage to the semiconductor light emitting element itself as the layer absorbing the laser beam is deformed. In addition, as the laser-based technology is used, expensive equipment is required, which increases a unit cost and a difficulty of the entire process.

Therefore, in the present disclosure, a mechanical lift-off (MLO) process is used to prevent the occurrence of such a problem. This will be described in detail below.

Figure 11:
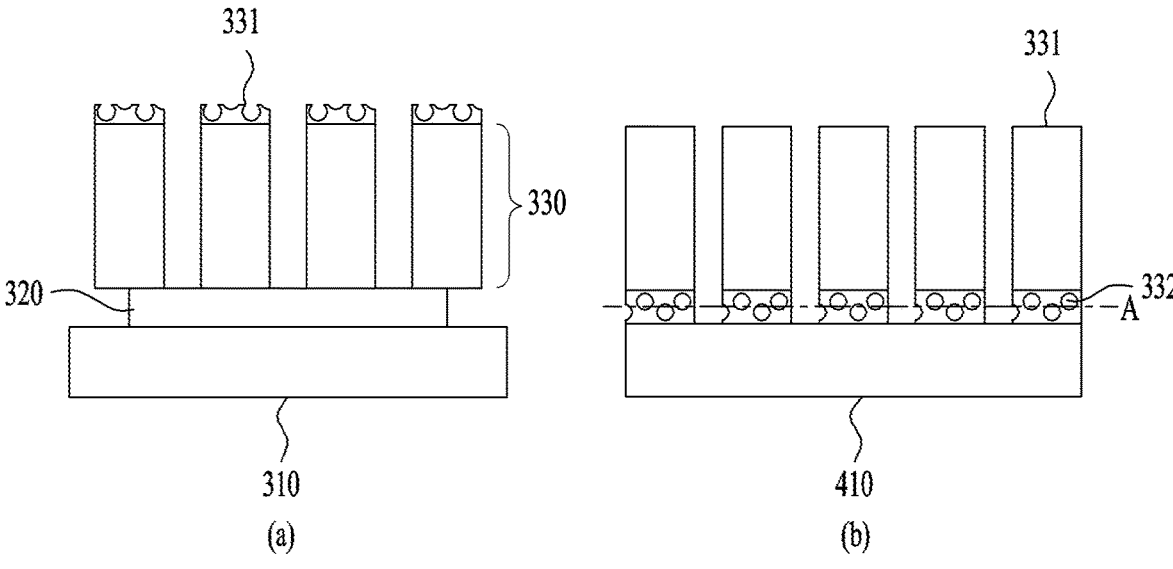
FIG. 11 is a view exaggeratively showing a cross-section of a nanorod-type semiconductor light emitting element.

FIG. 11 is a view exaggeratively showing a cross-section of a nanorod-type semiconductor light emitting element.

As shown in (a) in FIG. 11, in the display device according to one embodiment of the present disclosure, an end of the nanorod-type semiconductor light emitting element 330 located on an opposite side of one end thereof in contact with the lower electrode 320 may have a non-flat cross-section. That is, the opposite end of one end in contact with the lower electrode 320 may be a non-flat contact surface.

As shown in (b) in FIG. 11, in the present disclosure, in order to more easily use the MLO process, in the growing substrate 310 including the nanorod-type semiconductor light emitting elements, a porous region 332 may be formed on each nanorod-type semiconductor light emitting element using the etching. Specifically, in the state in which the nanorod-type semiconductor light emitting elements 331 are connected to the growing substrate 310 in the vertical direction (=a longitudinal direction), the porous regions 332 may be included at connection portions. The non-flat contact surface of such nanorod-type semiconductor light emitting element 330 may be formed by segmenting the porous region 332 after the nanorod-type semiconductor light emitting element 330 comes into contact with the lower electrode 320. A detailed manufacturing method will be described below with reference to FIG. 19.

Specifically, such non-flat contact surface may be formed in the MLO process, that is, a process of damaging the porous region 332 formed on the light emitting element 330 by applying a pressure thereto and separating the light emitting element 330 from the wiring substrate 310 in the transfer process of the light emitting element 330.

In this regard, only semiconductor light emitting elements 330 attached to the lower electrodes 320 arranged on the wiring substrate 310 are able to be selectively removed, and semiconductor light emitting elements 330 not coupled to the lower electrodes 320 are not removed from the growing substrate.

Accordingly, the lower electrodes 320 may be selectively transferred to correspond to pixel regions that are light emitting regions.

Conventionally, the transfer process had a problem of complicated process and high cost because the transfer process includes processes of removing the semiconductor light emitting elements grown on the growing substrate from the growing substrate and moving the semiconductor light emitting elements to a temporary substrate, then aligning the moved semiconductor light emitting elements, and then moving the temporary substrate including the aligned semiconductor light emitting elements onto the wiring substrate.

However, in the present disclosure, in order to solve such problem, the processes are simplified by omitting the step of transferring the semiconductor light emitting elements to the temporary substrate.

To this end, the above-described MLO process was used, and details will be described below.

Figure 12:
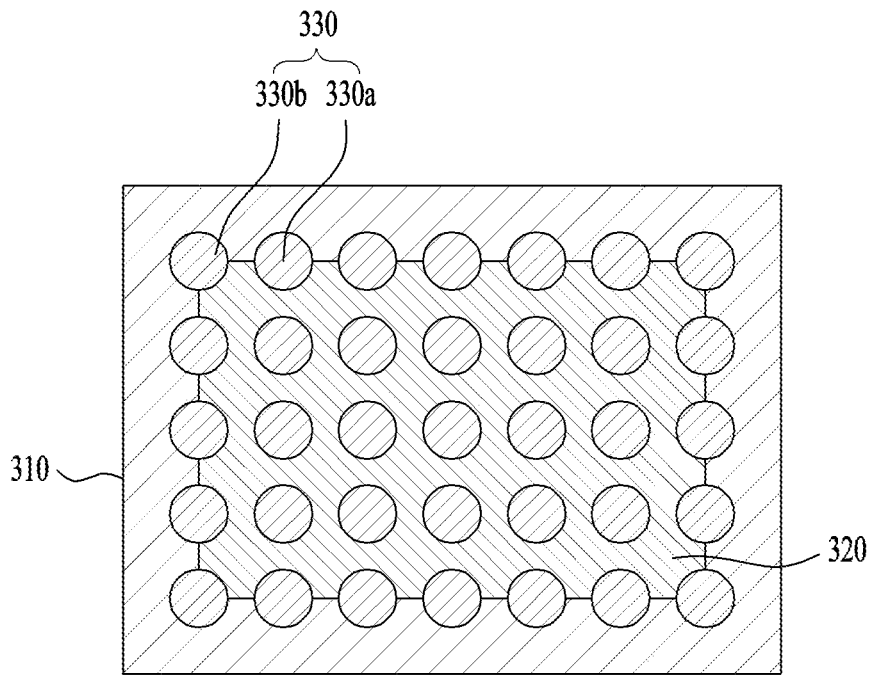
FIG. 12 is a top view of a base substrate on which nanorod-type light emitting elements are arranged.

FIG. 12 is a top view of a base substrate on which nanorod-type light emitting elements are arranged.

The plurality of nanorod-type light emitting elements 330 may be arranged on a top surface of the lower electrode 320 at a predetermined spacing. In this regard, the lower electrode 320 may be disposed on the wiring substrate 310 based on a size and a position of the light emitting region in the display device. To this end, the plurality of nanorod-type semiconductor light emitting elements 330 may be arranged in an entire region of the top surface of the lower electrode 320 with the predetermined spacing.

The lower electrode 320 may serve to define the light emitting region. The plurality of nanorod-type semiconductor light emitting elements 330 may be transferred to fit a region of the lower electrode 320 in a state of being vertically arranged on a growing substrate 410 (see (b) in FIG. 11), and define the light emitting region.

In this regard, it is preferable that ends of the plurality of nanorod-type semiconductor light emitting elements 330 are completely located within the region of the top surface of the lower electrode 320. However, in some cases, ends of some nanorod-type semiconductor light emitting elements 330 may be partially arranged over edges of the top surface of the lower electrode 320. That is, the plurality of nanorod-type semiconductor light emitting elements 330 may include a nanorod-type semiconductor light emitting element 330a completely located within the region of the lower electrode 320, and a nanorod-type semiconductor light emitting element 330b whose end is disposed over a boundary of the lower electrode 320.

According to one embodiment of the present disclosure, because the plurality of nanorod-type semiconductor light emitting elements 330 are transferred at once based on the size of the top surface of the lower electrode 320 while being grown at the predetermined spacing on the growing substrate 410, a step for separately aligning the nanorod-type semiconductor light emitting elements 330 may be omitted.

That is, according to one embodiment of the present disclosure, the light emitting element 330 may be positioned at a desired position of the pixel with high precision without going through the separate alignment process of the light emitting element 330.

Figure 13:
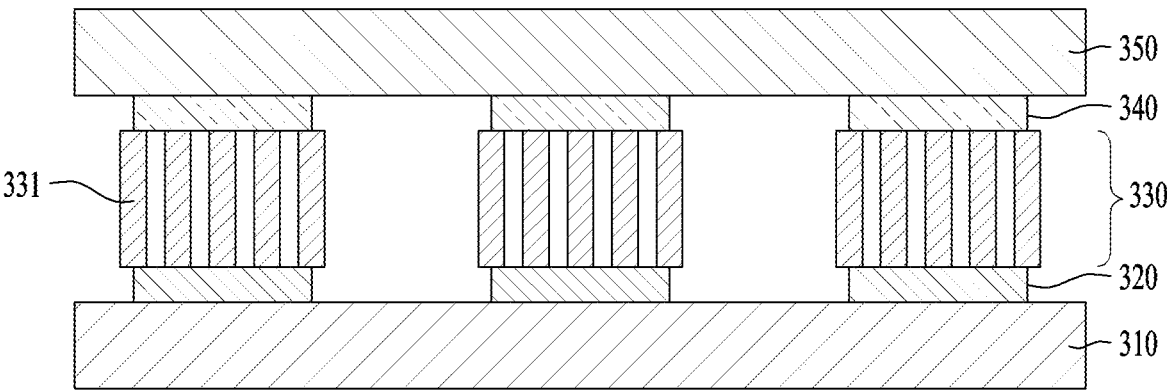
FIG. 13 is a view of a display device in which a subsequent process is performed on a base substrate including semiconductor light emitting elements.

FIG. 13 is a view of a display device in which a subsequent process is performed on a base substrate including semiconductor light emitting elements.

The display device including the semiconductor light emitting elements according to one embodiment of the present disclosure may further include upper electrodes 340 and a cover substrate 350 for a subsequent process for the wiring substrate 310 including the lower electrodes 320 and the semiconductor light emitting elements 330.

In this regard, each upper electrode 340 is disposed on the cover substrate 350 and is in contact with the plurality of nanorod-type semiconductor light emitting elements 330 so as to be connected to the plurality of nanorod-type semiconductor light emitting elements 330.

The cover substrate 350 may be an insulating layer for protecting the circuit pattern formed on the wiring substrate 310. Such cover substrate 350 may at least partially cover an outer surface of the cover substrate 250 or the semiconductor light emitting element 330 in order to protect the semiconductor light emitting element 330 and the wiring substrate 310.

Although only the upper electrodes 340 and the cover substrate 350 are shown in FIG. 13 as the subsequent processes, those skilled in the art may manufacture the display structure including the nanorod-type semiconductor light emitting element.

One embodiment of the present disclosure may manufacture the display device including the nanorod-type semiconductor light emitting element of various structures. This will be described below.

Figure 14:
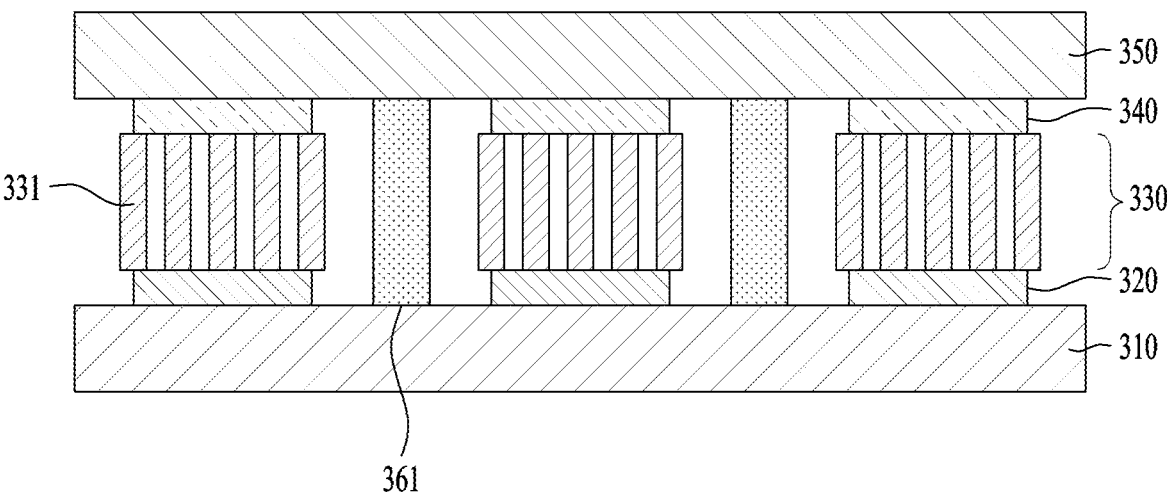
FIG. 14 is a view showing a multi-color display device using a color conversion structure using a phosphor as a display device according to an embodiment of the present disclosure.

FIG. 14 is a view showing a multi-color display device using a color conversion structure using a phosphor as a display device according to an embodiment of the present disclosure.

According to one embodiment of the present disclosure, the display device using the semiconductor light emitting elements includes the wiring substrate 310, the lower electrodes 320 disposed on the wiring substrate 310, the plurality of nanorod-type semiconductor light emitting elements 330 in contact with each lower electrode 320, each upper electrode 340 positioned at the other ends of the nanorod-type semiconductor light emitting elements 330 opposite to one ends of the nanorod-type semiconductor light emitting elements 330 where each lower electrode 320 is located, and in contact with the nanorod-type semiconductor light emitting elements 330, the cover substrate 350 disposed on the upper electrodes, and first partition walls 361.

In this regard, the first partition wall 361 is in contact with the wiring substrate 310 and the cover substrate 350 to separate one pixel composed of the lower electrode 320, the upper electrode 340, and the nanorod-type semiconductor light emitting elements 330. That is, a unit structure composed of one pixel may be separated by the first partition walls 361.

Such first partition wall 361 may prevent leakage of light from the semiconductor light emitting element 330. Furthermore, even in a case of using the phosphor or a color filter to be described later, the leakage of such light may be prevented and thus color mixing may be prevented.

In addition, such first partition walls 361 may serve to separate individual unit pixels from each other. Specifically, such first partition walls 361 are to restrict a printed region in order to prevent pattern spreading and color mixing resulted from thixotropy during pattern formation.

Figure 15:
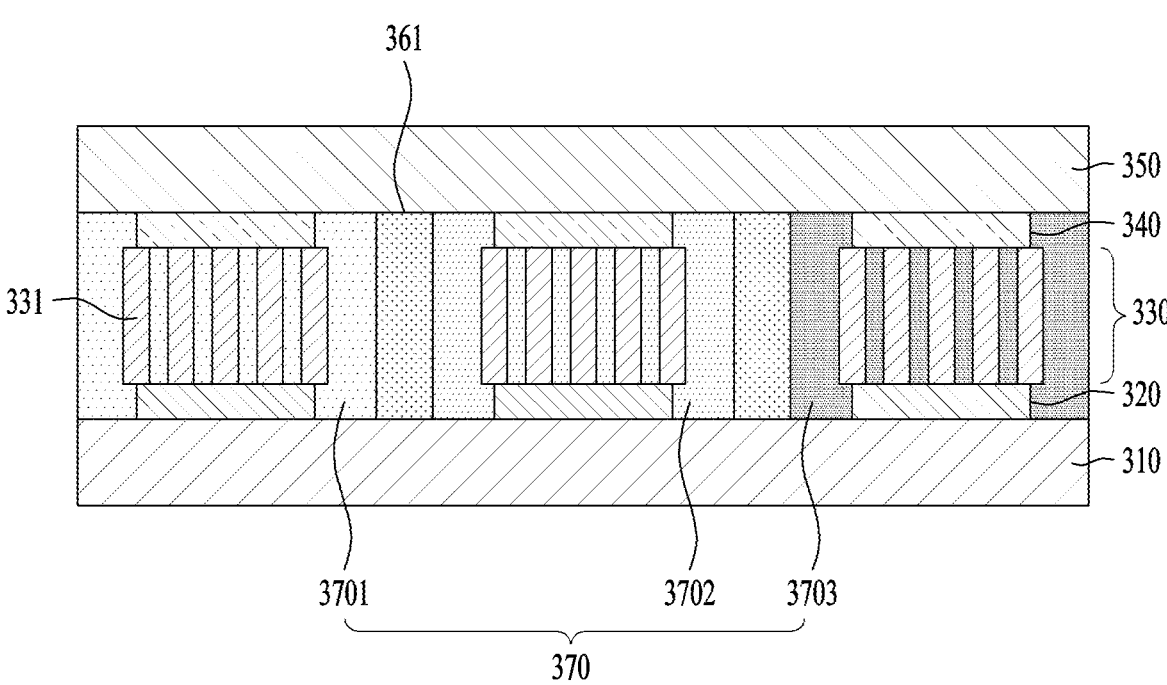
FIG. 15 is a view showing a display device using semiconductor light emitting elements further including a phosphor between first partition walls 260.

FIG. 15 is a view showing a display device using semiconductor light emitting elements further including a phosphor between first partition walls 361.

A phosphor 370 may fill a space defined between the first partition walls 361. Although not shown in FIG. 15, but the phosphor 370 may be composed of a phosphor and a phosphor binder fixing the phosphor.

The phosphor may correspond to at least one of a red phosphor 3701, a green phosphor 3702, and a blue phosphor 3703. The phosphor 370 may be at least one of an organic phosphor, a quantum dot, and an inorganic phosphor.

The phosphor binder, as a component for fixing the phosphor, may be made of a transparent material. An organic binder or an inorganic color conversion material may be used as the phosphor binder. Specifically, as the organic binder, an epoxy or silicone-based material may be mainly used. As the inorganic color conversion material, phosphor ceramic (PC), phosphor glass ceramic (PGC), and phosphor in glass (PiG) bulk glass phosphor (BGP) may be used.

In this regard, the phosphor 370 may be partially coated on the nanorod-type semiconductor light emitting elements 330 using an inkjet, or a pattern thereof may be formed via a photolithography process.

As such, according to the display device according to one embodiment of the present disclosure, the multi-color display may be implemented by applying the color conversion structure using the phosphor.

Figure 16:
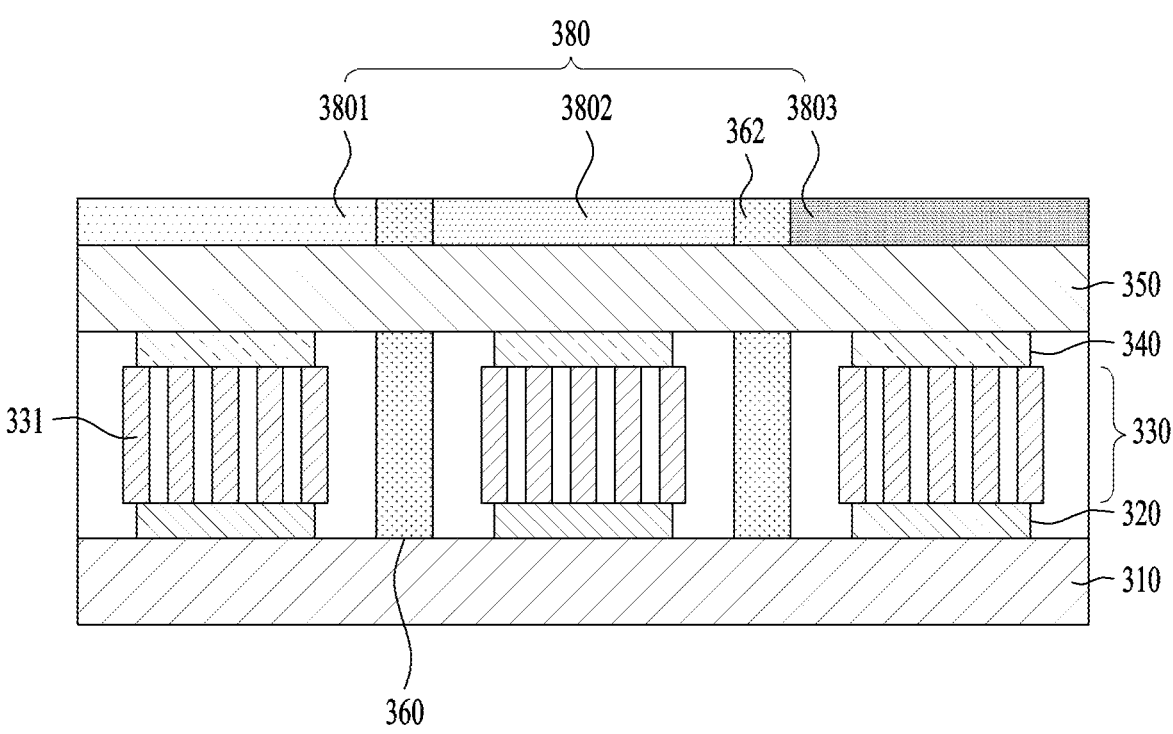
FIG. 16 is a view showing a display device using semiconductor light emitting elements further including second partition walls for separating a plurality of color filters from each other.

FIG. 16 is a view showing a display device using semiconductor light emitting elements further including second partition walls for separating a plurality of color filters from each other.

A color filter 380 may be a filter that passes light of a specific wavelength therethrough. Such color filter 380 may include a plurality of color filters 380 including a red color filter 3801, a green color filter 3802, and a blue color filter 3803.

In this regard, the plurality of color filters 380 may be separated from each other by the second partition walls 362. Such second partition walls 362 may be disposed on the cover substrate 350 to correspond to the unit structure separated by the first partition walls 361.

As such, according to the display device according to one embodiment of the present disclosure, the multi-color display may be implemented by applying the color conversion structure using the color filter.

According to the display device according to one embodiment of the present disclosure, a display device including both the phosphor 370 and the color filter 380 may be implemented. In this regard, the color filter 380 may prevent the light generated from the semiconductor light emitting element 330 and the light whose wavelength is converted via the phosphor 370 from being emitted by being mixed with each other.

Accordingly, a wavelength of the light generated by the semiconductor light emitting element 330 may be blocked, and a wavelength of the light converted via the phosphor 370 may pass. For example, when the semiconductor light emitting element 330 generates blue light and the phosphor 370 converts such blue light to red light, the color filter 380 may block the blue light and pass the red light.

The above characteristics of the present disclosure may be applied even when the wavelengths of the light emitted from the semiconductor light emitting elements 330 are different from each other, that is, when two or more types of semiconductor light emitting elements 330 are used. This will be described below.

Figure 17:
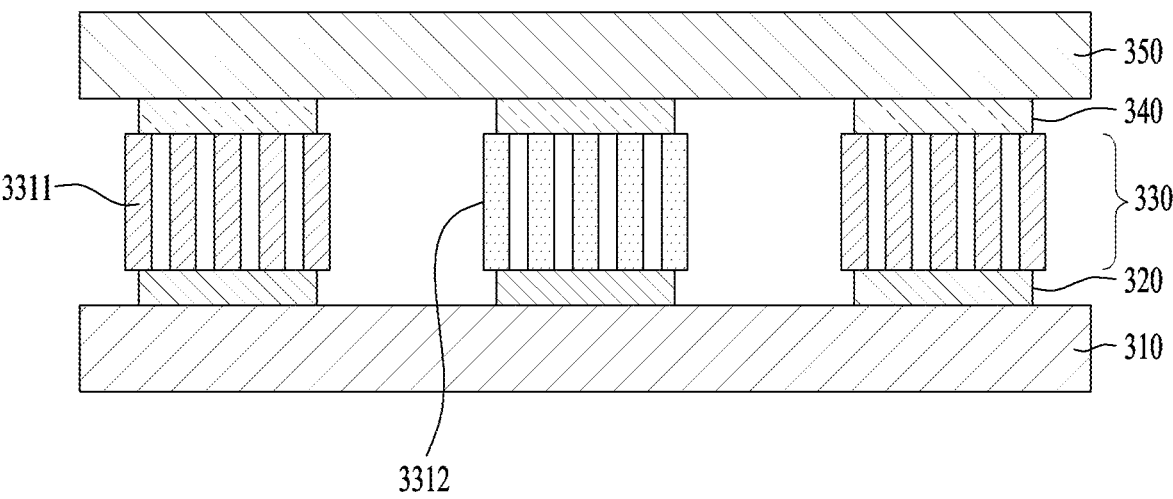
FIG. 17 is a view showing a display device including two types of semiconductor light emitting elements 2311 and 2312.

FIG. 17 is a view showing a display device including two types of semiconductor light emitting elements 3311 and 3312.

As shown in FIG. 17, the display device using the semiconductor light emitting elements 330 may include first nanorod-type semiconductor light emitting elements 3311 and second nanorod-type semiconductor light emitting elements 3312.

In this regard, the first nanorod-type semiconductor light emitting element 3311 and the second nanorod-type semiconductor light emitting element 3312 may emit light of different wavelengths. For example, the first nanorod-type semiconductor light emitting element 3311 may be a blue light emitting diode, and the second nanorod-type semiconductor light emitting element 3312 may be a red light emitting diode.

The first nanorod-type semiconductor light emitting elements 3311 may be vertically arranged on the wiring substrate 310 including the lower electrodes 320 to include non-flat contact surfaces at ends thereof in contact with each upper electrode. In this regard, the first nanorod-type semiconductor light emitting elements 3311 may be arranged in a portion selected as one pixel region.

The second nanorod-type semiconductor light emitting elements 3312 may be vertically disposed on the cover substrate 350 including the upper electrodes 340 to include non-flat contact surfaces at ends thereof in contact with the lower electrode. In this regard, the second nanorod-type semiconductor light emitting elements 3312 may be arranged in a portion selected as one pixel region.

By coupling such wiring substrate 310 and cover substrate 350, the display device including the two types of nanorod-type light emitting elements 330 may be obtained. In this regard, the pixel region including the first nanorod-type semiconductor light emitting elements 3311 and the pixel region including the second nanorod-type semiconductor light emitting elements 3312 may be arranged so as not to overlap each other.

Figure 18:
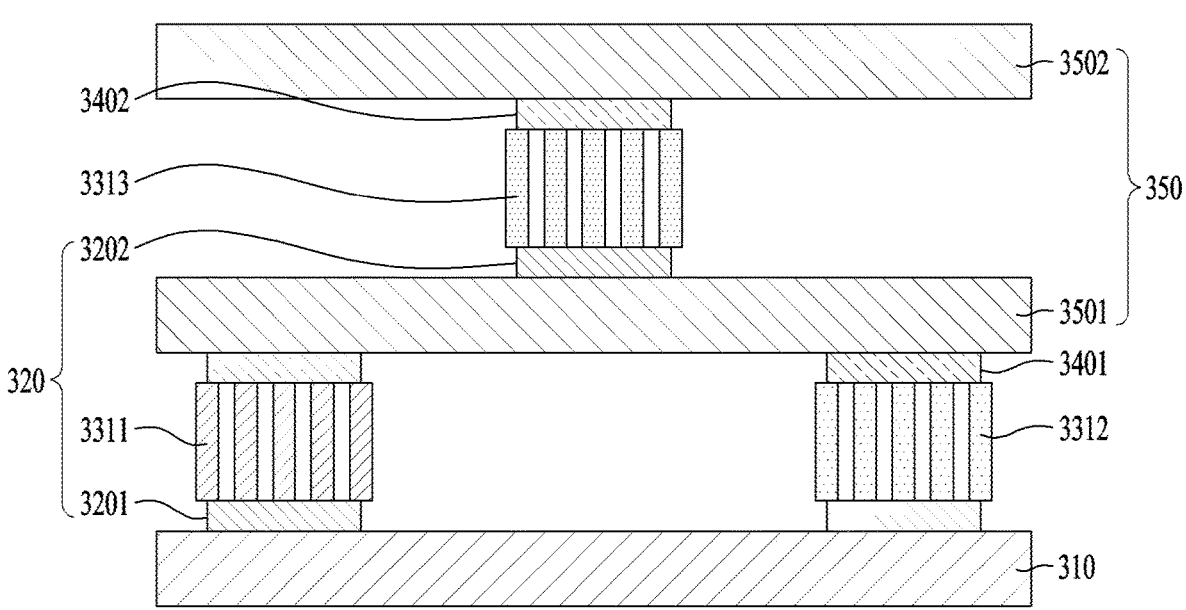
FIG. 18 is a view showing a display device including three types of semiconductor light emitting elements 2311, 2312, and 2313.

FIG. 18 is a view showing a display device including three types of semiconductor light emitting elements 3311, 3312, and 3313.

As shown in FIG. 18, the display device using the semiconductor light emitting elements 330 may include the first nanorod-type semiconductor light emitting elements 3311, the second nanorod-type semiconductor light emitting elements 3312, and the third nanorod-type semiconductor light emitting elements 3313.

The first nanorod-type semiconductor light emitting element 3311, the second nanorod-type semiconductor light emitting element 3312, and the third nanorod-type semiconductor light emitting element 3313 may emit light of different wavelengths. For example, the first nanorod-type semiconductor light emitting element 3311 may be the blue light emitting diode, the second nanorod-type semiconductor light emitting element 3312 may be the red light emitting diode, and the third nanorod-type semiconductor light emitting element 3313 may be a green light emitting diode.

The third nanorod-type semiconductor light emitting elements 3313 may be vertically arranged on an additional cover substrate 3502 including an additional upper electrode 3402, and ends thereof that are not in contact with the additional upper electrode 3402 may include non-flat contact surfaces.

The non-flat contact surfaces of such third nanorod-type semiconductor light emitting elements 3313 may be in contact with an additional lower electrode 3202 disposed on the substrate 3501 in a process of coupling the first, second, and third nanorod-type semiconductor light emitting elements 3311, 3312, and 3313.

The third nanorod-type semiconductor light emitting elements 3313 may be vertically arranged on the cover substrate 3501 corresponding to a separation space defined between the first and second nanorod-type semiconductor light emitting elements 3311 and 2312. In this regard, the first, second, and third nanorod-type semiconductor light emitting elements 3311, 3312, and 3313 may be arranged so as not to overlap each other.

Figure 19:
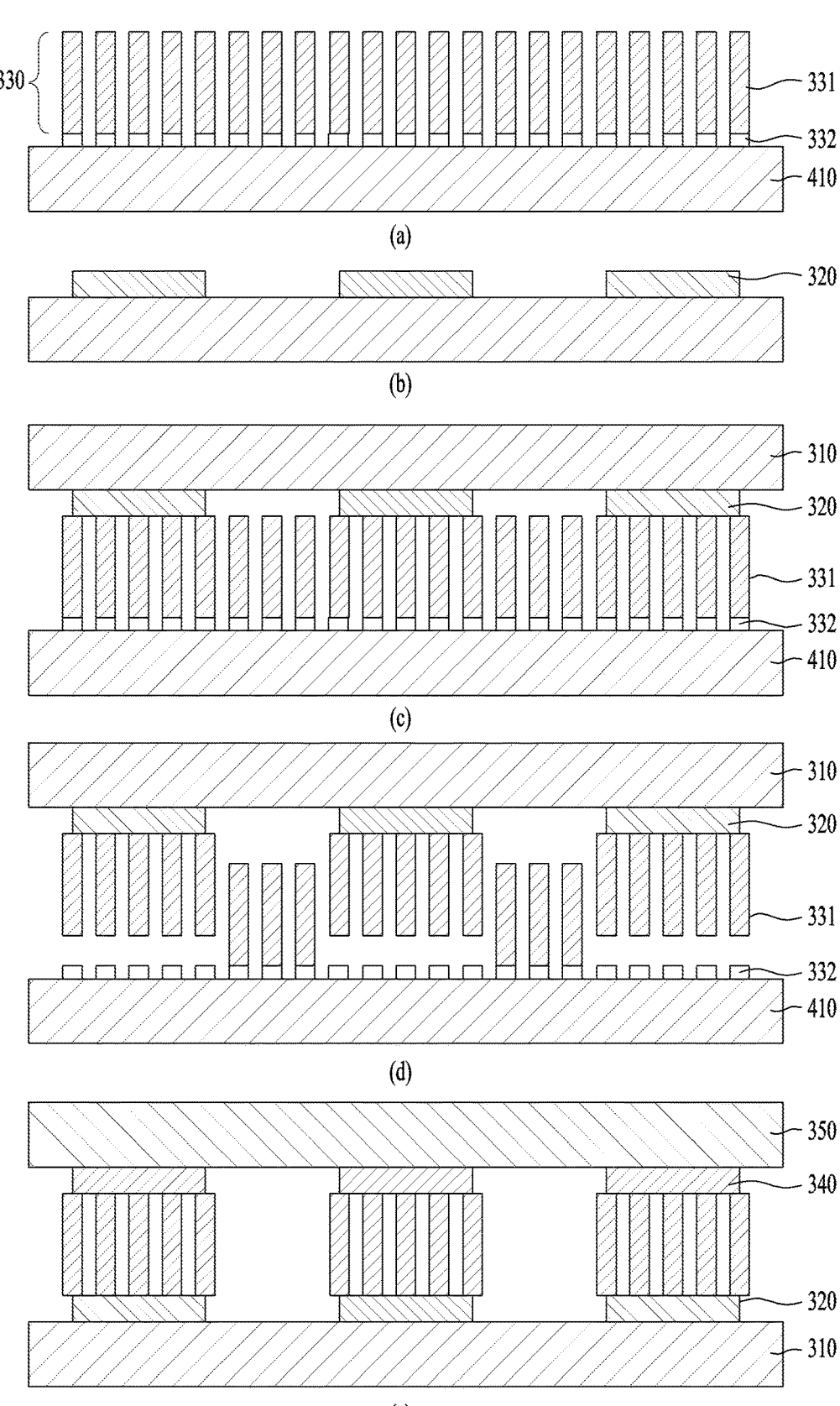
FIG. 19 is a view illustrating a method for manufacturing a display device including the plurality of nanorod-type semiconductor light emitting elements 230.

FIG. 19 is a view illustrating a method for manufacturing a display device including the plurality of nanorod-type semiconductor light emitting elements 330.

As shown in (a) in FIG. 19, the method for manufacturing the display device including the plurality of nanorod-type semiconductor light emitting elements 330 includes forming the plurality of first nanorod-type semiconductor light emitting elements 330 on the first growing substrate 410 at the predetermined spacing.

In this regard, the nanorod-type semiconductor light emitting element 330 may be formed by sequentially growing the first conductivity-type nanorod-type semiconductor, the multi quantum well, and the second conductivity-type nanorod-type semiconductor on the growing substrate 410. Such a nanorod shape may be obtained using any method capable of growing those into the nanorod shape on the growing substrate 410, such as a chemical vapor deposition (CVD) method, a molecular beam growth (MBE) method, or a hybrid vapor deposition (HVPE) method. In addition, such a nanorod shape may be formed by performing etching using a mask via a lithography process. In this regard, the first conductivity-type semiconductor and the second conductivity-type semiconductor may mean the n-type semiconductor and the p-type semiconductor, respectively, and conversely may mean the p-type semiconductor and the n-type semiconductor, respectively.

The method includes forming the porous structures 332 by etching the ends of the thus formed nanorod-type semiconductor light emitting elements 330.

In this regard, the porous structure 332 may be formed using electrochemical etching, but any other method capable of forming the porous structure may be used.

The porous structure 332 may be formed at an end of the nanorod-type semiconductor light emitting element 330 on a side of the first growing substrate 410.

As shown in (b) in FIG. 19, each lower electrode 320 may be disposed on the wiring substrate 310. Because of such a lower electrode 320, one light emitting region may be specified. For example, a region that emits the blue light, a region that emits the red light, or a region that emits the green light may be specified.

As shown in (c) and (d) in FIG. 19, the method includes bring the first growing substrate 410 including the first nanorod-type semiconductor light emitting elements 330 into contact with such wiring substrate 310.

In this regard, the semiconductor light emitting elements 330 may be placed on each lower electrode 320, and the light emitting elements 330 may be selectively transferred to form one pixel region. The separation for the transfer of the light emitting elements 330 may use a mechanical separation scheme. The mechanical separation may be performed by segmenting the porous regions 332 formed on the light emitting elements 330 by applying the pressure.

Therefore, the first nanorod-type semiconductor light emitting elements 330 arranged on each lower electrode 320 are separated from the first growing substrate 410, and the method includes removing the first growing substrate 410.

As shown in (e) in FIG. 19, the cover substrate 350 including each upper electrode 340 may be disposed on the light emitting elements 330 vertically arranged on each lower electrodes. In this regard, each upper electrode 340 may be in contact with the ends of the light emitting elements 330.

Cross-sections of the first nanorod-type semiconductor light emitting elements 330 in contact with each upper electrode 340 may be the non-flat surfaces. Such non-flat surfaces may be formed when the porous regions 332 are segmented in the process of mechanically separating the light emitting elements 330 from the first growing substrate 410.

According to one embodiment of the present disclosure, the display device including the light emitting elements emitting the light of the two or more wavelengths as well as the display device including the light emitting elements emitting the light of one wavelength may be manufactured.

Hereinafter, the display device including the two or more types of light emitting elements will be described later.

Figure 20:
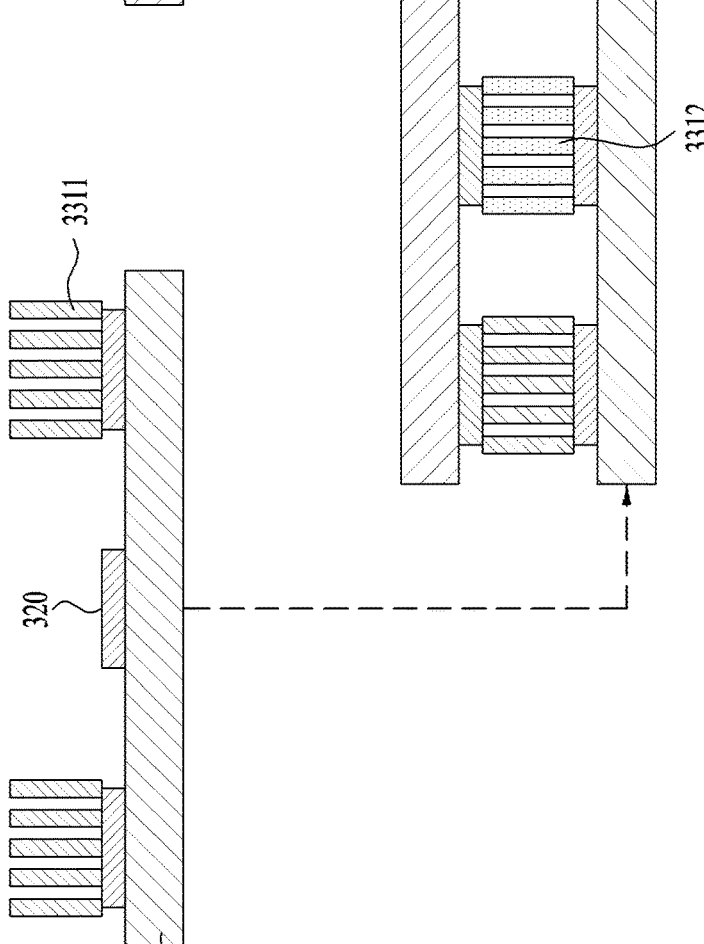
FIG. 20 is a view illustrating a method for manufacturing a display device including two types of semiconductor light emitting elements 230.

FIG. 20 is a view illustrating a method for manufacturing a display device including two types of semiconductor light emitting elements 330.

As shown in FIG. 20, the display device including the two types of semiconductor light emitting elements 330 may be manufactured by coupling the substrates 310 and 350 respectively including the semiconductor light emitting elements 3311 and 3312 emitting the light having the different wavelengths to each other.

Specifically, the method includes forming the plurality of second nanorod-type semiconductor light emitting elements 3312 emitting the light having the different wavelength on a second growing substrate at a predetermined spacing. In this regard, the method for forming the second nanorod-type semiconductor light emitting elements 3312 is the same as the method for forming the first nanorod-type semiconductor light emitting elements 3311 described above.

The method includes forming the porous structures 332 by etching the ends of the second nanorod-type semiconductor light emitting elements 3312 connected to the second growing substrate. In this regard, the porous structures 332 may be formed at ends of the elements 3312 on a side close to the second growing substrate.

The method includes bringing the second growing substrate into contact with the cover substrate 350 having each upper electrode 340 in a direction in which the second nanorod-type semiconductor light emitting elements 3312 are grown. Subsequently, the method includes separating the second nanorod-type semiconductor light emitting elements 3312 arranged on each upper electrode 340 from the second growing substrate and removing the second growing substrate.

In this regard, a detailed description of the separating of the light emitting elements 3312 and removing of the substrate is the same as that of the separating of the first nanorod-type semiconductor light emitting elements 3311 and the removing of the substrate.

The method includes forming the lower electrodes 320 on the wiring substrate 310 including the first nanorod-type semiconductor light emitting elements 3311 and forming the upper electrodes 340 on the cover substrate 350. Subsequently, the method includes stacking the cover substrate 350 on the wiring substrate 310 by bringing the lower electrode 320 disposed on the wiring substrate 310 into contact with the second nanorod-type semiconductor light emitting elements 3312, and bringing the upper electrode 340 disposed on the cover substrate 350 into contact with the first nanorod-type semiconductor light emitting elements 3311.

Figure 21:
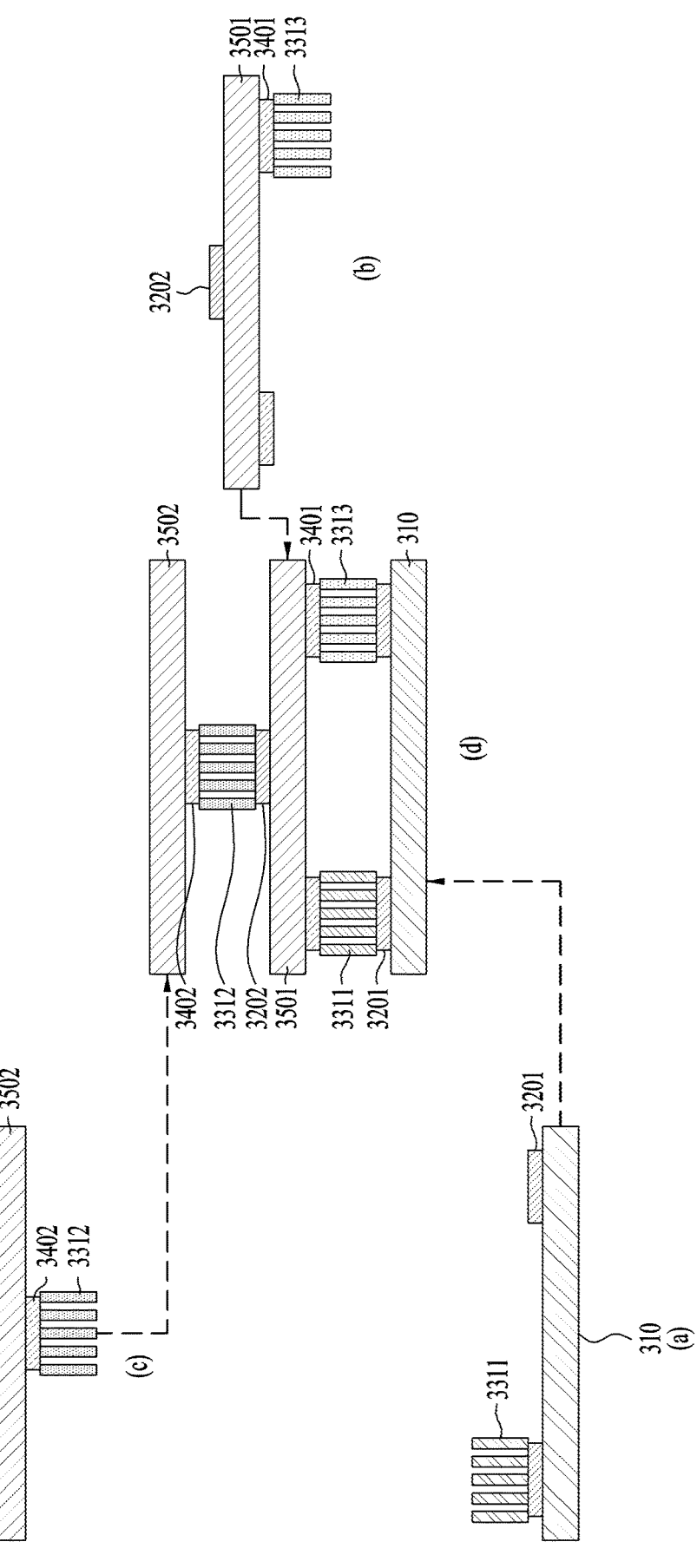
FIG. 21 is a view illustrating a method for manufacturing a display device including three types of semiconductor light emitting elements 230.

FIG. 21 is a view illustrating a method for manufacturing a display device including three types of semiconductor light emitting elements 330.

A method the same as the method for forming the second nanorod-type semiconductor light emitting elements 3312 described above is used. The method includes forming the third nanorod-type semiconductor light emitting elements 3313 connected to a third growing substrate and forming the porous regions at one ends thereof. In this regard, the porous regions may be formed at ends of the elements 3313 close to the third growing substrate.

The method includes transferring the third nanorod-type semiconductor light emitting elements 3313 by bringing the third growing substrate into contact with an additional cover substrate 3502 having an additional upper electrode 3402. In this regard, the third nanorod-type semiconductor light emitting elements 3313 and the additional upper electrode 3402 may be in contact with each other, and the other ends of the third nanorod-type semiconductor light emitting elements 3313 that are not in contact with the additional upper electrode 3402 may be the non-flat contact surfaces.

The method includes forming the additional lower electrode 3202 on the cover substrate 3501. Because of such additional lower electrode 3202, one pixel region may be defined.

The method includes coupling the cover substrate 3501 and the additional cover substrate 3502 to each other such that the additional lower electrode 3202 disposed on the cover substrate 3501 and the third nanorod-type semiconductor light emitting elements 3313 come into contact with each other.

In this regard, the first, second, and third nanorod-type semiconductor light emitting elements 3311, 3312, and 3313 may be arranged so as not to overlap each other, and may emit the light having the different wavelengths.

As such, according to an embodiment of the present disclosure, even when some of the plurality of light emitting elements are defective, there is no problem in driving one pixel, and thus high yield and process convenience may be obtained.

In addition, because one pixel region is defined by the electrodes located on the base substrate, there is no need to separately align the semiconductor light emitting elements, so that high-speed transfer may be achieved.

The above description is merely illustrative of the technical idea of the present disclosure. Those of ordinary skill in the art to which the present disclosure pertains will be able to make various modifications and variations without departing from the essential characteristics of the present disclosure.

Therefore, embodiments disclosed in the present disclosure are not intended to limit the technical idea of the present disclosure, but to describe, and the scope of the technical idea of the present disclosure is not limited by such embodiments. The scope of protection of the present disclosure should be interpreted by the claims below, and all technical ideas within the scope equivalent thereto should be construed as being included in the scope of the present disclosure.

REFERENCE NUMERALS

310: wiring substrate
320: lower electrode
330: semiconductor light emitting element
340: upper electrode
350: cover substrate
360: partition wall
370: phosphor
380: color filter

What is claimed is:

1. A display device using semiconductor light emitting elements, the display device comprising:
   a base substrate including circuit wiring;
   a lower electrode arranged on the base substrate and connected to the circuit wiring;
   a plurality of nanorod-type semiconductor light emitting elements spaced apart from each other and vertically arranged on the lower electrode;
   a cover substrate stacked on the plurality of nanorod-type semiconductor light emitting elements;
   an upper electrode disposed on the cover substrate and in contact with the plurality of nanorod-type semiconductor light emitting elements;
   first partition walls arranged between the base substrate and the cover substrate to separate a unit structure including the lower electrode, the plurality of nanorod-type semiconductor light emitting elements, and the upper electrode; and
   a phosphor filled in a space defined between the first partition walls,
   wherein each of the plurality of nanorod-type semiconductor light emitting elements comprises an opposite end having a non-flat contact surface formed by segmenting a porous region of the plurality of nanorod-type semiconductor light emitting elements.

2. The display device of claim 1, wherein the plurality of nanorod-type semiconductor light emitting elements are arranged at a predetermined spacing in an entire region of a top surface of the lower electrode.

3. The display device of claim 2, wherein at least some of the plurality of nanorod-type semiconductor light emitting elements are arranged on edges of the top surface of the lower electrode.

4. The display device of claim 1, further comprising:
   a plurality of color filters disposed on the cover substrate corresponding to a position of the unit structure; and
   second partition walls for separating the plurality of color filters from each other.

5. The display device of claim 1, wherein the plurality of nanorod-type semiconductor light emitting elements include:
   a first nanorod-type semiconductor light emitting element including a non-flat contact surface at an end in contact with the upper electrode; and
   a second nanorod-type semiconductor light emitting element including a non-flat contact surface at an end in contact with the lower electrode.

6. The display device of claim 5, wherein the first and second nanorod-type semiconductor light emitting elements emit light of different wavelengths, respectively.

7. The display device of claim 5, further comprising:
   an additional lower electrode disposed on a top surface of the cover substrate; and
   a plurality of third nanorod-type semiconductor light emitting elements spaced apart from each other and arranged vertically on the additional lower electrode.

8. The display device of claim 7, wherein the first to third nanorod-type semiconductor light emitting elements emit light of wavelengths different from each other.

9. The display device of claim 7, wherein the plurality of third nanorod-type semiconductor light emitting elements are arranged on the cover substrate corresponding to a separation space defined between the first and second nanorod-type semiconductor light emitting elements.

* * * * *